(12) United States Patent
Sasago et al.

(10) Patent No.: US 11,818,483 B2
(45) Date of Patent: Nov. 14, 2023

(54) PHOTOELECTRIC CONVERSION DEVICE AND METHOD OF DRIVING PHOTOELECTRIC CONVERSION DEVICE

(71) Applicant: CANON KABUSHIKI KAISHA, Tokyo (JP)

(72) Inventors: Tomoya Sasago, Kanagawa (JP); Yukihiro Kuroda, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 26 days.

(21) Appl. No.: 17/361,919

(22) Filed: Jun. 29, 2021

(65) Prior Publication Data

US 2022/0014698 A1  Jan. 13, 2022

(30) Foreign Application Priority Data

Jul. 10, 2020  (JP) .................. 2020-119104

(51) Int. Cl.
*H04N 25/709* (2023.01)
*H01L 31/107* (2006.01)
*H01L 27/146* (2006.01)

(52) U.S. Cl.
CPC ..... *H04N 25/709* (2023.01); *H01L 27/14643* (2013.01); *H01L 31/107* (2013.01)

(58) Field of Classification Search
CPC ............. H04N 5/3698; H04N 5/37455; H04N 5/23241; H04N 5/23245; H04N 5/235; H04N 5/2351; H04N 5/351; H04N 5/243; H04N 5/369; H04N 5/36965; H04N 5/3745; H04N 5/378; H04N 25/709; H04N 25/772; H01L 27/14643; H01L 31/107; H01L 27/14625; H01L 31/02027; H01L 27/14609

See application file for complete search history.

(56) References Cited

U.S. PATENT DOCUMENTS

| 7,709,869 B2 | 5/2010 | Kuroda |
| 7,911,521 B2 | 3/2011 | Kuroda |
| 7,935,995 B2 | 5/2011 | Watanabe |
| 8,174,599 B2 | 5/2012 | Kuroda |

(Continued)

FOREIGN PATENT DOCUMENTS

| JP | 2016146286 A | 8/2016 |
| JP | 2018182051 A | 11/2018 |

*Primary Examiner* — Albert H Cutler
(74) *Attorney, Agent, or Firm* — VENABLE LLP

(57) ABSTRACT

A photoelectric conversion device includes a plurality of pixels each including an avalanche diode, a quench unit reducing the avalanche multiplication of the avalanche diode, a pulse conversion unit converting an output signal of the avalanche diode into pulses, and a signal generation unit generating an accumulation signal obtained by accumulating the number of pulses, a detection unit detecting whether or not the width of the pulse is not smaller than a predetermined width, and a voltage control unit controlling a reverse bias voltage applied to the avalanche diode within a range not lower than the breakdown voltage of the avalanche diode based on the result of the detection. The voltage control unit lowers the reverse bias voltage within a range not lower than the breakdown voltage when the accumulation value of pixels whose pulse width is not smaller than a predetermined width is not smaller than a predetermined value.

12 Claims, 14 Drawing Sheets

(56) References Cited

U.S. PATENT DOCUMENTS

| | | |
|---|---|---|
| 8,222,682 B2 | 7/2012 | Watanabe |
| 8,223,238 B2 | 7/2012 | Kuroda |
| 8,345,137 B2 | 1/2013 | Shinohara |
| 8,390,713 B2 | 3/2013 | Kuroda |
| 8,670,058 B2 | 3/2014 | Hayashi |
| 8,710,558 B2 | 4/2014 | Inoue |
| 8,994,862 B2 | 3/2015 | Kuroda |
| 9,048,370 B1* | 6/2015 | Urmson ............. G01R 31/2635 |
| 9,236,406 B2 | 1/2016 | Kuroda |
| 9,305,954 B2 | 4/2016 | Kato |
| 9,357,122 B2 | 5/2016 | Kususaki |
| 9,445,023 B2 | 9/2016 | Kuroda |
| 9,762,837 B2 | 9/2017 | Kuroda |
| 10,021,316 B2 | 7/2018 | Kuroda |
| 10,404,932 B2 | 9/2019 | Kuroda |
| 10,419,695 B2 | 9/2019 | Sasago |
| 10,609,320 B2 | 3/2020 | Kuroda |
| 10,652,496 B2 | 5/2020 | Goden |
| 10,991,541 B2 | 4/2021 | Ikeda |
| 11,069,823 B2 | 7/2021 | Kuroda |
| 2012/0175503 A1 | 7/2012 | Kuroda |
| 2014/0328466 A1* | 11/2014 | Proksa ...................... G01T 1/18 378/62 |
| 2017/0131143 A1* | 5/2017 | Andreou ......... H01L 31/035272 |
| 2020/0018831 A1* | 1/2020 | Azuma ................. G01S 7/4873 |
| 2020/0044109 A1 | 2/2020 | Azuma et al. |
| 2020/0084396 A1 | 3/2020 | Kuroda |
| 2020/0132817 A1* | 4/2020 | Ueno ................... G01S 7/4861 |
| 2020/0158566 A1 | 5/2020 | Ota |
| 2020/0314375 A1* | 10/2020 | Nishino ................. H04N 5/351 |
| 2020/0386889 A1* | 12/2020 | Shimizu ............... G01S 7/4863 |
| 2021/0025990 A1* | 1/2021 | Ozawa ............. H01L 27/14607 |
| 2021/0044768 A1 | 2/2021 | Kuroda |
| 2021/0092275 A1* | 3/2021 | Gnecchi ................. H04N 5/374 |
| 2021/0105427 A1* | 4/2021 | Bianchi ..................... G01J 1/46 |

* cited by examiner

PHOTOELECTRIC CONVERSION DEVICE AND METHOD OF DRIVING PHOTOELECTRIC CONVERSION DEVICE

BACKGROUND

Field

The present disclosure relates to a photoelectric conversion device and a method of driving the same.

Description of the Related Art

A photoelectric conversion device is known which digitally counts the number of photons arriving at the light receiving portion and outputs the count value as a digital signal from a pixel. Japanese Patent Application Laid-Open No. 2018-182051 discloses a technique of controlling the sensitivity of a light receiving portion of a photoelectric conversion device which outputs a pulse signal in response to the incidence of a photon to a photoelectric conversion element so that a pulse rate which is the number of outputs per unit time of the pulse signal from the light receiving portion becomes a preset value.

However, in the technique disclosed in Japanese Patent Application Laid-Open No. 2018-182051, it is not taken into consideration that signals continuously output from the photoelectric conversion element cannot be separated as respective voltage pulses due to interference, and the pulse rate sometimes falls far below the theoretical value at high luminance.

SUMMARY

An object of the present disclosure is to provide a photon-count type photoelectric conversion device capable of performing appropriate sensitivity adjustment at high brightness, and a method of driving the same.

According to one aspect of the present disclosure, there is provided a photoelectric conversion device including a plurality of pixels each including an avalanche diode that photoelectrically converts incident light and multiplies generated charge by an avalanche multiplication, a quench unit that reduces the avalanche multiplication of the avalanche diode, a pulse conversion unit that converts an output signal of the avalanche diode into pulses, and a signal generation unit that generates an accumulation signal obtained by integrating or accumulating a number of pulses output from the pulse conversion unit, a detection unit that detects whether or not the pulse output from the pulse conversion unit has a width not smaller than a predetermined width, and a voltage control unit that controls a reverse bias voltage applied to the avalanche diode within a range not lower than a breakdown voltage of the avalanche diode based on a detection result of the detection unit, wherein the voltage control unit includes an accumulation unit that accumulates a number of pixels that output a pulse having a pulse width not smaller than the predetermined width and a signal comparison unit that compares an accumulation value by the accumulation unit with a predetermined value, and when the accumulation value is not less than the predetermined value, the reverse bias voltage applied to the avalanche diode is lowered within a range not lower than the breakdown voltage of the avalanche diode.

According to another aspect of the present disclosure, there is provided a method of driving a photoelectric conversion device including a plurality of pixels each including an avalanche diode that photoelectrically converts incident light and multiplies generated charge by avalanche multiplication, a quench unit that reduces the avalanche multiplication of the avalanche diode, a pulse conversion unit that converts an output signal of the avalanche diode into pulses, and a signal generation unit that generates an accumulation signal obtained by integrating or accumulating a number of pulses output from the pulse conversion unit, the method including performing a sensitivity adjustment period for adjusting a sensitivity of the pixels, performing, after the sensitivity adjustment period, an exposure period for generating the accumulation signal, and performing, after the exposure period, a readout period for reading out the accumulation signal, wherein, in the sensitivity adjustment period, whether or not the width of the pulse output from the pulse conversion unit is not smaller than a predetermined width is detected, and a reverse bias voltage applied to the avalanche diode is controlled based on a detection result within a range not lower than a breakdown voltage of the avalanche diode.

Further features of the present invention will become apparent from the following description of exemplary embodiments with reference to the attached drawings.

DESCRIPTION OF THE EMBODIMENTS

Preferred embodiments of the present disclosure will now be described in detail in accordance with the accompanying drawings.

First Embodiment

Figure 1:
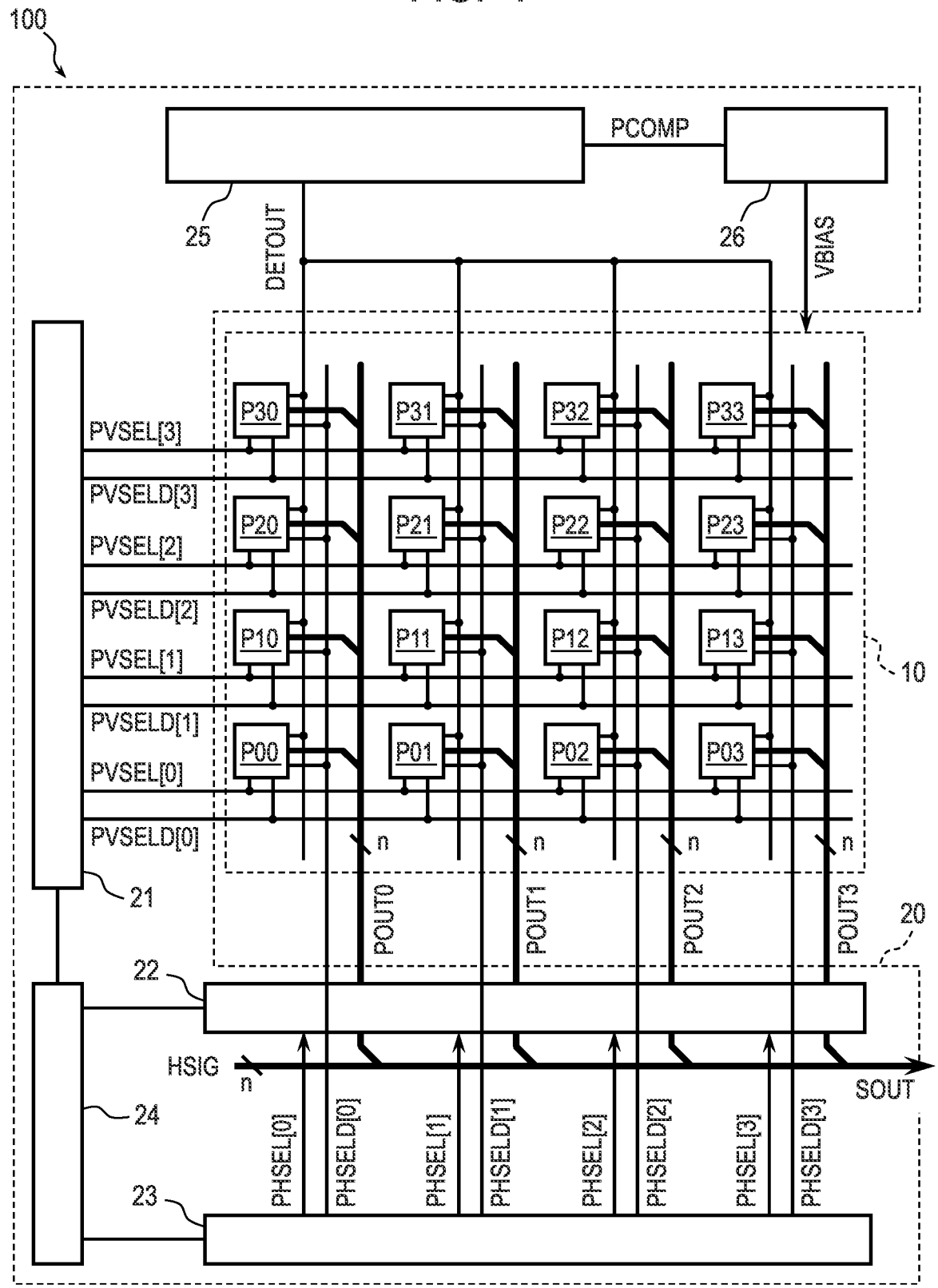
FIG. 1 is a block diagram illustrating a schematic configuration of a photoelectric conversion device according to a first embodiment of the present disclosure.
Figure 2:
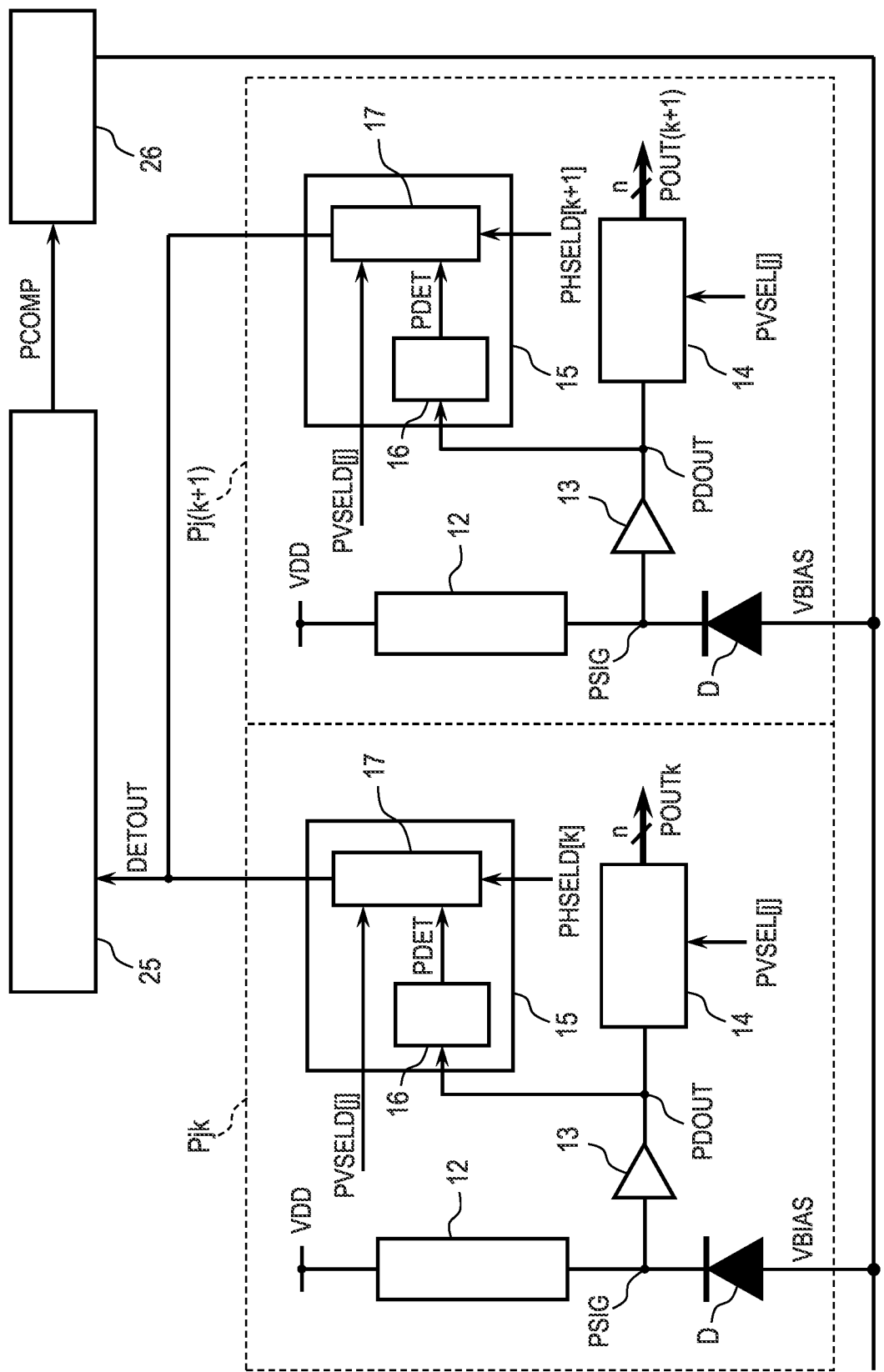
FIG. 2 is a schematic diagram illustrating a configuration example of a pixel in the photoelectric conversion device according to the first embodiment of the present disclosure.
Figure 3:
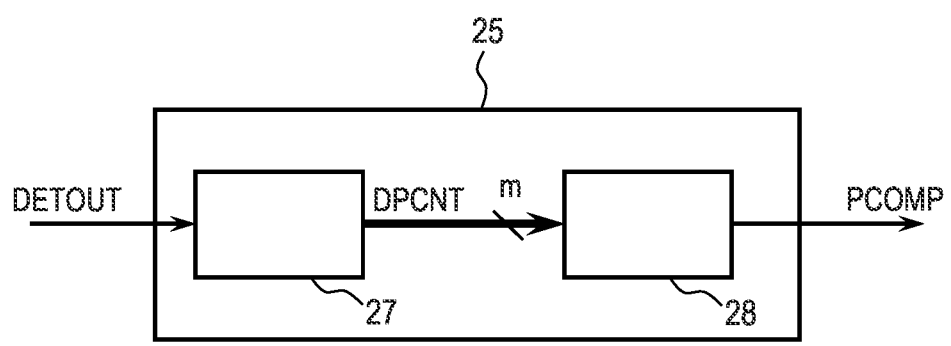
FIG. 3 is a diagram illustrating a configuration example of a voltage control unit in the photoelectric conversion device according to the first embodiment of the present disclosure.
Figure 4A:
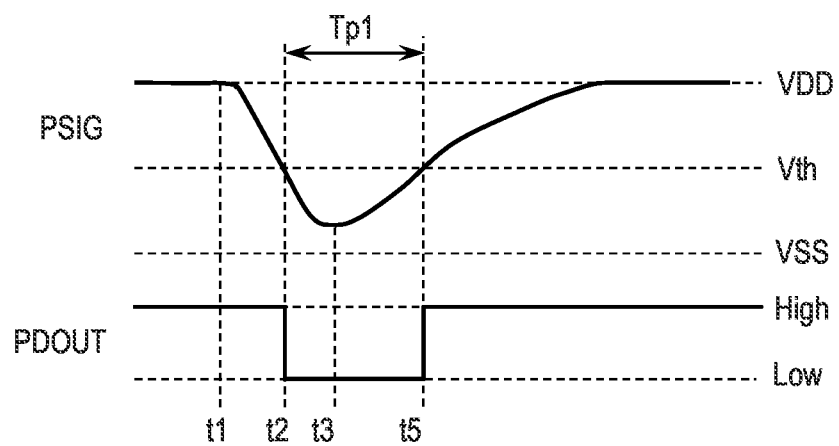
FIG. 4A, FIG. 4B and FIG. 5 are timing diagrams illustrating the operation of the pixel in the photoelectric conversion device according to the first embodiment of the present disclosure.
Figure 5:
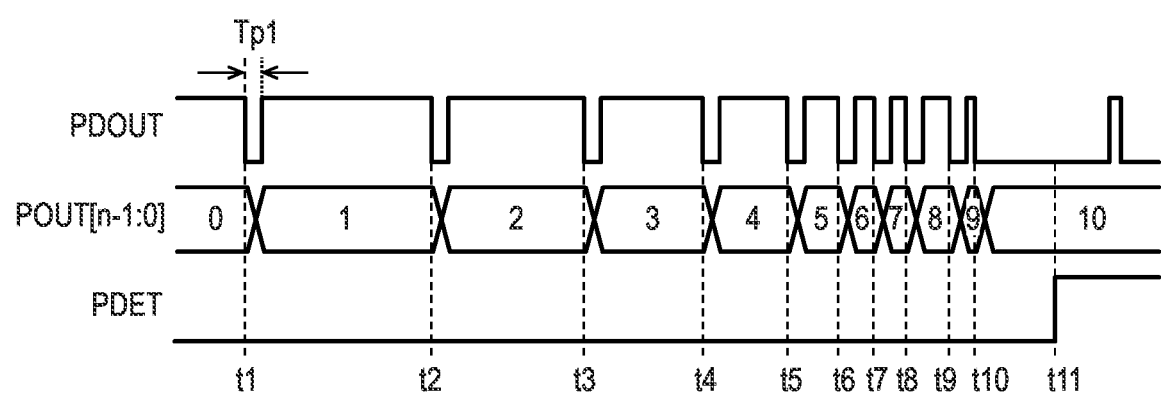
Figure 6:
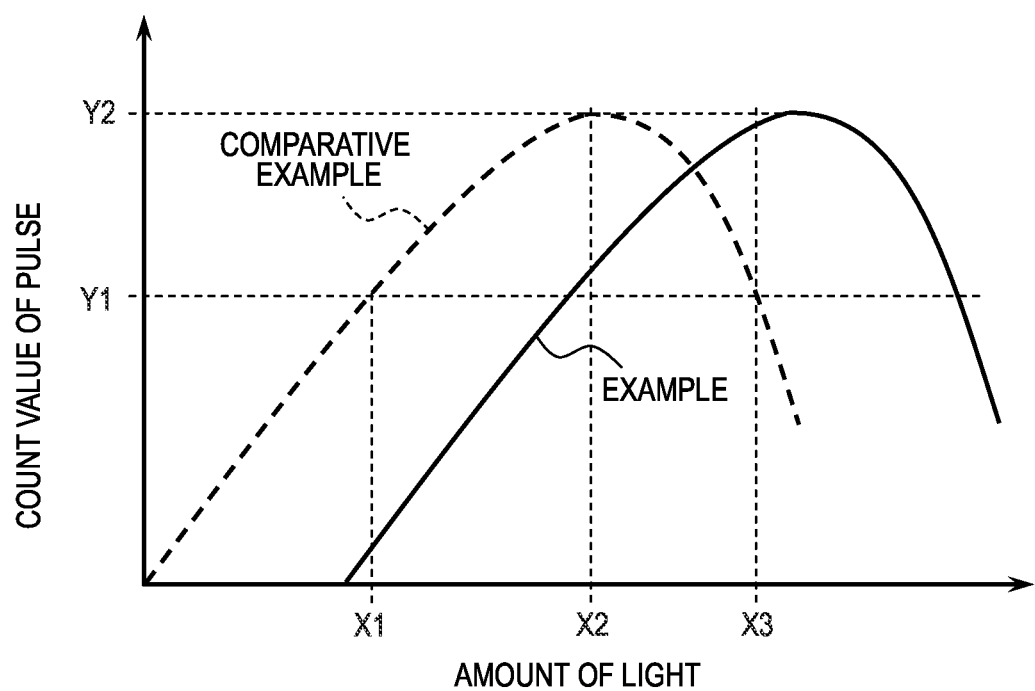
FIG. 6 is a diagram illustrating an example of photoelectric conversion characteristics of the pixel in the photoelectric conversion device according to the first embodiment of the present disclosure.

A photoelectric conversion device according to a first embodiment of the present disclosure will be described with reference to FIG. 1 to FIG. 6. FIG. 1 is a block diagram illustrating a schematic configuration of a photoelectric conversion device according to the present embodiment. FIG. 2 is a schematic diagram illustrating a configuration example of a pixel in the photoelectric conversion device according to the present embodiment. FIG. 3 is a schematic diagram illustrating a configuration example of the voltage control unit in the photoelectric conversion device according to the present embodiment. FIG. 4A to FIG. 5 are timing diagrams illustrating the operation of the pixel in the photoelectric conversion device according to the present embodiment. FIG. 6 is a diagram illustrating an example of photoelectric conversion characteristics of pixels in the photoelectric conversion device according to the present embodiment.

First, a schematic configuration of a photoelectric conversion device according to this embodiment will be described with reference to FIG. 1.

As illustrated in FIG. 1, the photoelectric conversion device 100 according to the present embodiment includes a sensor unit 10 and a circuit unit 20. The circuit unit 20 includes a row selection circuit 21, a signal processing circuit 22, a column selection circuit 23, a control circuit 24, a voltage control unit 25, and a voltage supply unit 26.

The sensor unit 10 is provided with a plurality of pixels P arranged in a matrix over a plurality of rows and a plurality of columns. In FIG. 1, 16 pixels P arranged in 4 rows from the 0th row to the 3rd row and 4 columns from the 0th column to the 3rd column are illustrated together with reference numerals indicating row numbers and column numbers. For example, the pixels P arranged in the 1st row and the 3rd column are denoted by "P13". The number of rows and columns of the pixel array constituting the sensor unit 10 is not particularly limited.

The row selection circuit 21 is a circuit unit that generates control signals PVSEL and PVSELD for controlling the plurality of pixels P arranged in the sensor unit 10 in row units. The control signal PVSEL is a control signal for driving a signal generation circuit (corresponds to a signal generation unit 14 described later) in the pixel P. The control signal PVSELD is a control signal for driving a detection circuit (corresponds to a detection unit 15 described later) in the pixel P.

In each row of the pixel array of the sensor unit 10, control lines connected to the row selection circuit 21 and supplying the control signals PVSEL and PVSELD generated by the row selection circuit 21 to the pixels P of the corresponding row are arranged. Each of the control lines is connected to the pixels P arranged in the row direction, and forms a signal line common to these pixels P. In FIG. 1, the control signals PVSEL and PVSELD supplied to the respective control lines are illustrated together with reference numerals indicating line numbers. For example, the control lines in the 1st row are denoted by "PVSEL [1]" and "PVSELD [1]".

Output lines POUT are arranged in the column direction in each column of the pixel array of the sensor unit 10. Each of the output lines POUT is connected to the pixels P arranged in the column direction, and forms a signal line common to these pixels P. In FIG. 1, the output lines POUT are illustrated together with reference numerals indicating column numbers. For example, the output line in the 3rd column is labeled with "POUT3". Each output line POUT includes n signal lines for outputting an n-bit digital signal. The output line POUT is connected to the signal processing circuit 22.

The signal processing circuit 22 performs predetermined signal processing on the signal output from the pixel P, and holds the processed signal. The signal processing circuit 22 includes a plurality of column memories (not illustrated) provided corresponding to respective columns of the pixel array of the sensor unit 10. The column memory of each column is connected to the output line POUT of the corresponding column, and has a function of holding the signal read out from the pixel P via the output line POUT of the corresponding column. Since the signal output from the pixel P is an n-bit signal input through the n signal lines of the output line POUT, each of the column memories includes at least n holding units for holding the signals of each bit.

The column selection circuit 23 is a circuit unit that generates control signals PHSEL for controlling the plurality of column memories of the signal processing circuit 22 in a column unit and control signals PHSELD for controlling the plurality of pixels P arranged in the sensor unit 10 in a column unit. The control signal PHSEL is a control signal for selecting a column memory holding a signal to be read out to a horizontal output line HSIG. The control signal PHSELD is a control signal for driving the detection circuit (corresponds to the detection unit 15 described later) in the pixel P.

The signal processing circuit 22 is provided with control signal lines connected to the column selection circuit 23 and each supplying the control signal PHSEL generated by the column selection circuit 23 to the column memory of the corresponding column. The column memory receiving the control signal PHSEL from the column selection circuit 23 outputs the held signal as an output signal SOUT of the photoelectric conversion device 100 to the outside via the horizontal output line HSIG. In FIG. 1, the control signal PHSEL supplied to each control signal line is illustrated together with a reference numeral indicating a column number. For example, the control line in the 3rd column is denoted by "PHSEL [3]". The horizontal output line HSIG includes n signal lines for outputting an output signal SOUT of an n-bit digital signal.

Each column of the pixel array of the sensor unit 10 is provided with a control line connected to the column selection circuit 23 and supplying the control signal PHSELD generated by the column selection circuit 23 to the pixels P of the corresponding column. Each of the control lines is connected to the pixels P arranged in the column direction, and forms a signal line common to these pixels P. In FIG. 1, a control signal PHSELD supplied to each control line is illustrated with a reference numeral indicating a column number. For example, the control line in the 3rd column is denoted by "PHSELD [3]".

An output line DETOUT is connected to each of the plurality of pixels P constituting the sensor unit 10. The detection circuit (corresponds to the detection unit 15 described later) which has received the control signal PHSELD from the column selection circuit 23 outputs the detection signal to the output line DETOUT. In this specification, the detection signal output to the output line DETOUT is sometimes referred to as a detection signal DETOUT.

The voltage control unit 25 is a circuit unit that accumulates the number of detection signals output from the pixel P via the output line DETOUT and compares the accumulated value with a predetermined value (reference value). The voltage control unit 25 has a function of generating a control signal PCOMP according to the result of the comparison between the accumulated value and the predetermined value, and supplying the control signal PCOMP to the voltage supply unit 26 via a control line. The voltage supply unit 26 is a circuit unit that supplies the power supply voltage VBIAS to the pixel P. The voltage supply unit 26 has a function of setting the voltage VBIAS to be supplied to the pixel P in accordance with the control signal PCOMP received from the voltage control unit 25.

The voltage supply unit 26 is not necessarily provided in the photoelectric conversion device 100, but may be provided in an external apparatus. In this case, the control signal PCOMP of the voltage control unit 25 may be output to a device external to the photoelectric conversion device 100, and the power supply voltage VBIAS supplied to the photoelectric conversion device 100 may be set by the external device. The voltage supply unit 26 (or a corresponding external device) may be configured to set the power supply voltage VDD supplied to the pixel P in accordance with the control signal PCOMP. Alternatively, the voltage supply unit 26 may be configured to set both the power supply voltage VBIAS and the power supply voltage VDD in accordance with the control signal PCOMP.

The control circuit 24 is a circuit unit that supplies control signals for controlling the operation and timing of the row selection circuit 21, the signal processing circuit 22, and the column selection circuit 23. At least a part of the control signals for controlling the operation and timing of the row selection circuit 21, the signal processing circuit 22 and the column selection circuit 23 may be supplied from outside the photoelectric conversion device 100.

Next, a configuration example of the pixel P in the photoelectric conversion device according to the present embodiment will be described with reference to FIG. 2. FIG. 2 illustrates two pixels P arranged in two adjacent columns (k-th and (k+1)-th columns) of the same row (j-th line), a voltage control unit 25, and a voltage supply unit 26.

As illustrated in FIG. 2, each pixel P includes an avalanche multiplication type avalanche diode D, a quench unit 12, a pulse conversion unit 13, a signal generation unit 14, and a detection unit 15. The detection unit 15 includes a period detection unit 16 and a selector unit 17.

The anode of the avalanche diode D is connected to a voltage supply unit 26 that supplies the power supply voltage VBIAS. The cathode of the avalanche diode D is connected to one terminal of the quench unit 12 and the input terminal of the pulse conversion unit 13. Hereinafter, the connection portion of the cathode of the avalanche diode D, the one terminal of the quench unit 12, and the input terminal of the pulse conversion unit 13 will be referred to as a node PSIG. The other terminal of the quench unit 12 is connected to a power supply node supplied with the power supply voltage VDD.

The output terminal of the pulse conversion unit 13 is connected to the input terminal of the signal generation unit 14 and the input terminal of the period detection unit 16 of the detection unit 15. Hereinafter, the connection portion of the output terminal of the pulse conversion unit 13, the input terminal of the signal generation unit 14, and the input terminal of the period detection unit 16 of the detection unit 15 is referred to as a node PDOUT. The output terminal of the signal generation unit 14 is connected to the output line POUT. The output terminal of the period detection unit 16 is connected to the input terminal of the selector unit 17. The output terminal of the selector unit 17 is connected to the voltage control unit 25 via an output line DETOUT. The signal generation unit 14 is supplied with the control signal PVSEL from the row selection circuit 21. The selector unit 17 is supplied with the control signal PVSELD from the row selection circuit 21 and the control signal PHSELD from the column selection circuit 23.

The avalanche diode D has a function of photoelectrically converting incident light and multiplying the generated charge by avalanche multiplication. The quench unit 12 has a role of reducing and/or suppressing avalanche multiplication of the avalanche diode D. The quench unit 12 is not particularly limited, but may be constituted by, for example, a resistor or a transistor. The pulse conversion unit 13 has a function of converting the output signal of the avalanche diode D into a pulse. The pulse conversion unit 13 is not particularly limited, but may be constituted by, for example, an inverter circuit.

The signal generation unit 14 has a function of generating an accumulation signal obtained by integrating or accumulating the number of pulses output from the pulse conversion unit 13. The signal generation unit 14 may include a counter. The signal generation unit 14 outputs the accumulation signal to the output line POUT of the corresponding column in response to the control signal PVSEL from the row selection circuit 21.

The detection unit 15 has a function of detecting whether or not the width of the voltage pulse output from the pulse conversion unit 13 is not smaller than a predetermined width. A period detection unit 16 outputs a low level signal PDET when the width of the voltage pulse is smaller than the predetermined width, and outputs a high level signal PDET when the width of the voltage pulse is not smaller than the predetermined width. The selector unit 17 outputs the detection result by the period detection unit 16 to the output line DETOUT in accordance with the control signal PVSELD from the row selection circuit 21 and the control signal PHSELD from the column selection circuit 23. In FIG. 2, each pixel P includes a detection unit 15. As a result, the width of all the voltage pulses output from the pulse conversion unit 13 of each pixel P may be individually detected and accuracy may be improved, but this configuration is not essential. For example, one detection unit 15 may be arranged for a plurality of pixels P, or the detection unit 15 may be arranged outside the pixels P.

Next, a configuration example of the voltage control unit 25 in the photoelectric conversion device according to the present embodiment will be described with reference to FIG. 3.

As illustrated in FIG. 3, for example, the voltage control unit 25 may be comprised of an accumulation unit 27 and a signal comparison unit 28. The input terminal of the accumulation unit 27, which is also the input terminal of the voltage control unit 25, is connected to the output line DETOUT. The output terminal of the accumulation unit 27 is connected to the input terminal of the signal comparison unit 28. The output terminal of the signal comparison unit 28, which is also the output terminal of the voltage control unit 25, is connected to the voltage supply unit 26. The accumulation unit 27 may include a counter. The signal comparison unit 28 may include a comparator circuit.

Next, an outline of the operations of the pixel P, the voltage control unit 25, and the voltage supply unit 26 will be described with reference to FIG. 2 and FIG. 3.

A reverse bias voltage of a magnitude not lower than the breakdown voltage is applied to the avalanche diode D from the power supply nodes to which the power supply voltages VDD and VBIAS are supplied via the quench unit 12. Thus, the avalanche diode D becomes an operatable state in the Geiger mode.

When a photon is incident, the avalanche diode D generates a large number of electrons (and holes) by avalanche multiplication due to electrons excited by the incident photon. When a current generated by avalanche multiplication flows into the quench unit 12, a voltage drop occurs in the quench unit 12. As a result, the voltage applied to the avalanche diode D decreases, and the operation region of the avalanche diode D transitions to the non-Geiger mode. When the avalanche multiplication is stopped, the voltage drop of the quench unit 12 returns to the original level, and the operation region of the avalanche diode D again enters the Geiger mode. The number of electrons (and holes) generated by avalanche multiplication in Geiger mode depends on the path by which the photoelectrically converted electrons (and holes) are multiplied. Therefore, the amount of change in the potential of the node PSIG due to the voltage drop of the quench unit 12 has a certain variation.

The number of electrons (and holes) generated by avalanche multiplication in the Geiger mode depends on the voltage applied to the avalanche diode D. That is, as the voltage applied to the avalanche diode D increases, the number of electrons (and holes) generated by avalanche multiplication increases, and the voltage drop in the quench unit 12 increases. On the other hand, as the voltage applied to the avalanche diode D is lower, the number of electrons (and holes) generated by avalanche multiplication decreases, and the voltage drop in the quench unit 12 decreases.

The avalanche diode D, the quench unit 12, and the pulse conversion unit 13 constitute a light receiving unit that outputs pulses in response to the incidence of photons. A pulse conversion unit 13 converts a change in the potential of the node PSIG into a pulse signal the state of which transitions in accordance with a predetermined threshold voltage. With such a configuration, a voltage pulse corresponding to the incidence of the photon is output from the node PDOUT which is an output node of the pulse conversion unit 13.

Normally, the voltage applied to the avalanche diode D is set so as not to be affected by variations in the voltage drop of the quench unit 12 due to the multiplication path of the photoelectrically converted electrons (and holes). That is, the voltage applied to the avalanche diode D is set so that the change in the potential of the node PSIG is sufficiently large relative to the threshold voltage of the pulse conversion unit 13. On the other hand, when the voltage applied to the avalanche diode D is reduced, the number of electrons (and holes) generated by avalanche multiplication is reduced. As a result, the probability that the pulse conversion unit 13 outputs the pulse signal in response to the incident light may be reduced due to the influence of variations in the voltage drop of the quench unit 12. That is, the sensitivity may be reduced. In the present embodiment, the reverse bias voltage applied to the avalanche diode is controlled within a range not lower than the breakdown voltage of the avalanche diode. Specifically, the reverse bias voltage applied to the avalanche diode is controlled from a first value sufficiently large relative to the threshold voltage to a value not lower than the threshold voltage and lower than the first value. Thus, the sensitivity may be reduced.

A signal generation unit 14 includes a counter and counts voltage pulses output from the pulse conversion unit 13. The signal generation unit 14 outputs the count result as a signal POUT, which is an n-bit digital signal, in response to the control signal PVSEL supplied from the row selection circuit 21. The output terminal of the signal generation unit 14 includes n signal lines for outputting the signal POUT for each bit.

The period detection unit 16 is configured to detect the width (length of the period during which the signal level is maintained at a high or low level) of the voltage pulse output from the pulse conversion unit 13. The period detection unit 16 detects whether or not the width of the voltage pulse output from the light receiving unit is not smaller than a predetermined width, and outputs a signal PDET corresponding to the detection result to the selector unit 17. The signal PDET is a signal in which a state (signal level) changes when the width of a voltage pulse indicating that a photon has been incident is not smaller than a predetermined width.

The selector unit 17 outputs the signal PDET output from the period detection unit 16 to the output line DETOUT as the detection signal DETOUT based on the control signal PVSELD supplied from the row selection circuit 21 and the control signal PHSELD supplied from the column selection circuit 23.

The voltage control unit 25 controls the voltage applied to the avalanche diode D in the range of the breakdown voltage of the avalanche diode D based on the detection signal DETOUT. More specifically, the voltage control unit 25 includes an accumulation unit 27 that accumulates the number of pixels P (detection pixel) having a width of the voltage pulse not smaller than the predetermined width, and a signal comparison unit 28 that compares the accumulation value by the accumulation unit 27 with the predetermined value.

The accumulation unit 27 includes a counter, counts the detection signal DETOUT output from the selector unit 17 of each pixel P, and outputs a signal DPCNT, which is an m-bit digital signal representing a count value, to the signal comparison unit 28. That is, the accumulation unit 27 counts the pixels P (detection pixel) in which the width of the voltage pulse indicating that the photon has entered is not smaller than a predetermined width. FIG. 3 illustrates an example in which the accumulation unit 27 includes an m-bit counter.

The signal comparison unit 28 outputs a control signal PCOMP corresponding to the result of comparison between the value of the signal DPCNT output from the accumulation unit 27 and a predetermined value. For example, the signal comparison unit 28 compares the number of detection pixels with a predetermined value, and outputs a high-level control signal PCOMP when the number of detection pixels is not less than the predetermined value.

The predetermined value used as a reference for the determination in the signal comparison unit 28 is not particularly limited. For example, the number of pixels P of a predetermined ratio among the plurality of pixels P constituting the sensor unit 10 may be set to the predetermined value as a reference for determination. Alternatively, the number of pixels P of all the pixels P constituting the sensor unit 10 may be set to the predetermined value. The pixels P for which the period detection unit 16 detects the width of the voltage pulse may be all of a plurality of pixels P constituting the sensor unit 10, or may be a part of a plurality of pixels P constituting the sensor unit 10.

The voltage supply unit 26 sets a voltage to be applied to the avalanche diode D in accordance with the control signal PCOMP output from the signal comparison unit 28. For example, the voltage supply unit 26 increases the power supply voltage VBIAS supplied to the anode in response to receiving the high-level control signal PCOMP. Typically, the power supply voltage VBIAS is a negative high voltage, which reduces the voltage applied to the avalanche diode D. The power supply voltage VBIAS is set in a range in which a reverse bias voltage of a magnitude not lower than the breakdown voltage is applied to the avalanche diode D. Although the voltage applied to the anode is controlled in the present embodiment, the voltage applied to the cathode may be controlled.

Next, the operation of the pixel P in the photoelectric conversion device according to the present embodiment will be described with reference to FIG. 4A to FIG. 6.

When no photon enters the avalanche diode D, the potential of the cathode (node PSIG) of the avalanche diode D is the voltage VDD. At this time, the signal level of the output terminal (node PDOUT) of the pulse conversion unit 13 is assumed to be a predetermined high level (High).

FIG. 4A is a timing diagram illustrating the operation of the pulse conversion unit 13 when one photon is incident on the avalanche diode D. In FIG. 4A, "PSIG" represents the potential of the node PSIG, and "PDOUT" represents the potential of the node PDOUT. The voltage VDD is a power supply voltage supplied to the pulse conversion unit 13 and the cathode side of the avalanche diode D, the voltage VSS is a reference voltage supplied to the pulse conversion unit 13, and the threshold voltage Vth is a voltage at which the level of the output signal of the pulse conversion unit 13 is inverted.

It is assumed that a photon enters the avalanche diode D at time t1. Then, electron-hole pair is generated by photoelectric conversion in the avalanche diode D, and a current generated by avalanche multiplication flows through the quench unit 12. As a result, a voltage drop occurs in the quench unit 12, and as illustrated in FIG. 4A, the potential of the node PSIG gradually drops from the voltage VDD.

At the following time t2, when the potential of the node PSIG becomes lower than the predetermined threshold voltage Vth, the level of the potential of the node PDOUT changes from the high level to the predetermined low level (Low).

At the following time t3, when the operation region of the avalanche diode D deviates from the Geiger mode and the avalanche multiplication of the avalanche diode D stops, the voltage drop of the quench unit 12 starts to return to the original state and the potential of the node PSIG gradually increases.

At the following time t5, when the potential of the node PSIG reaches or exceeds the threshold voltage Vth, the level of the potential of the node PDOUT returns from the low level to the high level.

As described above, when one photon is incident on the avalanche diode D, a voltage pulse having a low-level period Tp1 is output from the pulse conversion unit 13 to the node PDOUT. The length of the period Tp1 depends on the physical constants constituting the avalanche diode D and the circuit constants of the quench unit 12 and the pulse conversion unit 13, and is substantially constant.

FIG. 4A illustrates a case where one voltage pulse is generated for the incidence of one photon, but depending on the timing at which the photon is incident, there may be a case where the incidence of the photon does not correspond to the generation of the voltage pulse on a one-to-one basis. An example of this will be described with reference to the timing diagram of FIG. 4B.

Figure 4B:
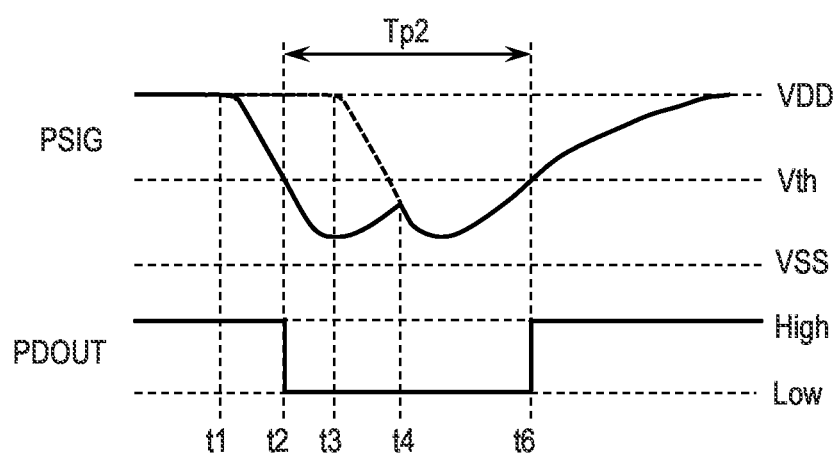

FIG. 4B is a timing diagram illustrating the operation of the pulse conversion unit 13 when two photons are incident on the avalanche diode D during a period shorter than the period Tp1. In FIG. 4B, "PSIG" represents the potential of the node PSIG, and "PDOUT" represents the potential of the node PDOUT.

It is assumed that a photon enters the avalanche diode D at time t1. Then, electron-hole pairs are generated by photoelectric conversion in the avalanche diode D, and a current generated by avalanche multiplication flows through the quench unit 12. As a result, a voltage drop occurs in the quench unit 12, and as illustrated in FIG. 4B, the potential of the node PSIG gradually drops from the voltage VDD.

At the following time t2, when the potential of the node PSIG becomes lower than the predetermined threshold voltage Vth, the level of the potential of the node PDOUT changes from the high level to the predetermined low level (Low).

At the following time t3, when the operation region of the avalanche diode D deviates from the Geiger mode and the avalanche multiplication of the avalanche diode D stops, the voltage drop of the quench unit 12 starts to return to the original state and the potential of the node PSIG gradually increases.

However, if the photon is incident again at time t3, the potential of the node PSIG starts to drop again at time t4 before the threshold voltage Vth is exceeded due to avalanche multiplication. When the avalanche multiplication due to the incidence of the second photon stops, the voltage drop of the quench unit 12 starts to return to the original state, and the potential of the node PSIG gradually increases again.

At the following time t6, when the potential of the node PSIG reaches or exceeds the threshold voltage Vth, the level of the potential of the node PDOUT returns from the low level to the high level.

In FIG. 4B, a voltage pulse having a low level period Tp2 is output from the pulse conversion unit 13. In this case, the number of voltage pulses output from the pulse conversion unit 13 is less than the number of photons incident on the avalanche diode D. This phenomenon is caused by the fact that the incident rate of the photon exceeds the generation rate of the voltage pulse, and becomes remarkable under the environment of high luminance.

FIG. 5 is a timing diagram illustrating the relationship between the potential of the node PDOUT, the signal POUT, and the signal PDET.

It is assumed that the count value (signal POUT [n−1:0]) of the counter of the signal generation unit 14 is 0 in the period before the time t1. The signal PDET is at a predetermined low level when the width of the voltage pulse is smaller than a predetermined width, and is shifted to a predetermined high level when the width of the voltage pulse is not smaller than a predetermined width. In the period before time t1, the signal PDET is assumed to be at a low level.

As illustrated in FIG. 5, it is assumed that photons are incident at each timing from time t1 to time t10. As a result, a voltage pulse corresponding to the incident timing of the photon is output from the pulse conversion unit 13 to the node PDOUT.

The signal generation unit 14 counts the voltage pulses output from the pulse conversion unit 13 to the node PDOUT and outputs the result as the signal POUT. FIG. 5 illustrates a case where, after the time t1, the result counted by the signal generation unit 14 is sequentially output as the signal POUT according to the timing at which the photon enters.

Here, it is assumed that a voltage pulse having a width longer than the period Tp1, which is a pulse width corresponding to the incidence of one photon, is output from the pulse conversion unit 13 at time t10. As described with reference to FIG. 4B, this is based on the assumption of high brightness light incidence.

A period detection unit 16 makes the signal PDET transition from a low level to a high level when the width (length of the period during which the signal is low level) of a voltage pulse output to a node PDOUT exceeds a prescribed time. For example, as illustrated in FIG. 5, the period detection unit 16 makes the signal PDET transition from the low level to the high level at a time t11 when the length of the period in which the voltage pulse is at the low level exceeds a predetermined time.

FIG. 6 is a graph illustrating an example of photoelectric conversion characteristics of the pixel P. In FIG. 6, the horizontal axis indicates the amount of light incident on the pixel P, and the vertical axis indicates the count value of the voltage pulse generated by the incident photon. The value on the vertical axis corresponds to the value of the signal POUT output from the signal generation unit 14.

When the amount of light incident on the pixel P is relatively small, as described with reference to FIG. 4A, the incidence of photons and the generation of voltage pulses correspond to each other on a substantially one-to-one basis. Therefore, for example, in the case of the light amount X2 or less, the count value of the pulse increases as the incident light amount increases.

However, when the quantity of incident light to the pixel P increases, as described with reference to FIG. 4B, the incident rate of the photons exceeds the generation rate of the voltage pulses, and one voltage pulse is generated corresponding to the incidence of a plurality of photons. This degree becomes more pronounced as the amount of light incident on the pixel P increases.

Therefore, when the amount of light incident on the pixel P exceeds the light amount X2 in the configuration without the period detection unit 16, the count value of the pulse decreases as the amount of light increases, as illustrated by the dotted line as "COMPARATIVE EXAMPLE" in FIG. 6. For example, the count value of the pulse becomes the same Y1 in the light amount X1 and the light amount X3, and the difference in the amount of light cannot be distinguished.

In the present embodiment, the power supply voltage VBIAS supplied to the anode of the avalanche diode D is lowered when the number of detection pixels whose length of the period during which the voltage pulse is at the low level exceeds a predetermined value or more. When the power supply voltage VBIAS supplied to the anode of the avalanche diode D is lowered, the photoelectric conversion characteristics may be parallelly translated in the direction of a high light amount side as illustrated by a solid line as "EXAMPLE" in FIG. 6. That is, the sensitivity may be reduced. Therefore, the sensitivity may be adjusted even in a state of high luminance in which the difference in the amount of light cannot be distinguished.

Figure 7:
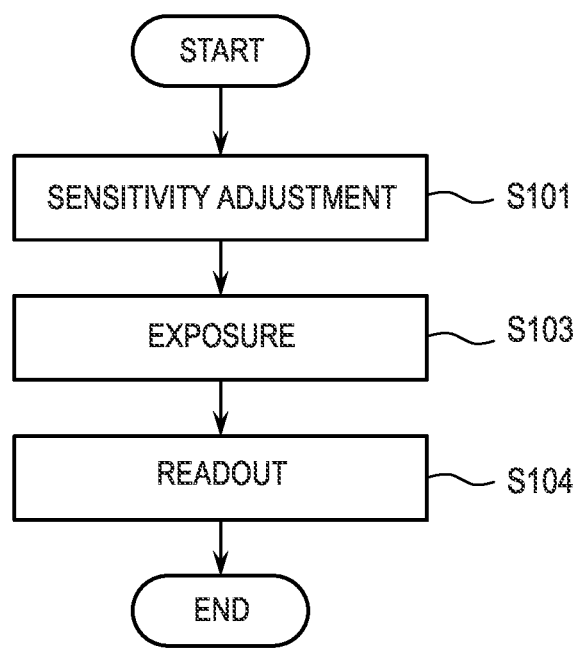
FIG. 7 and FIG. 8 are flowcharts illustrating an example of an imaging method in the photoelectric conversion device according to the first embodiment of the present disclosure.
Figure 8:
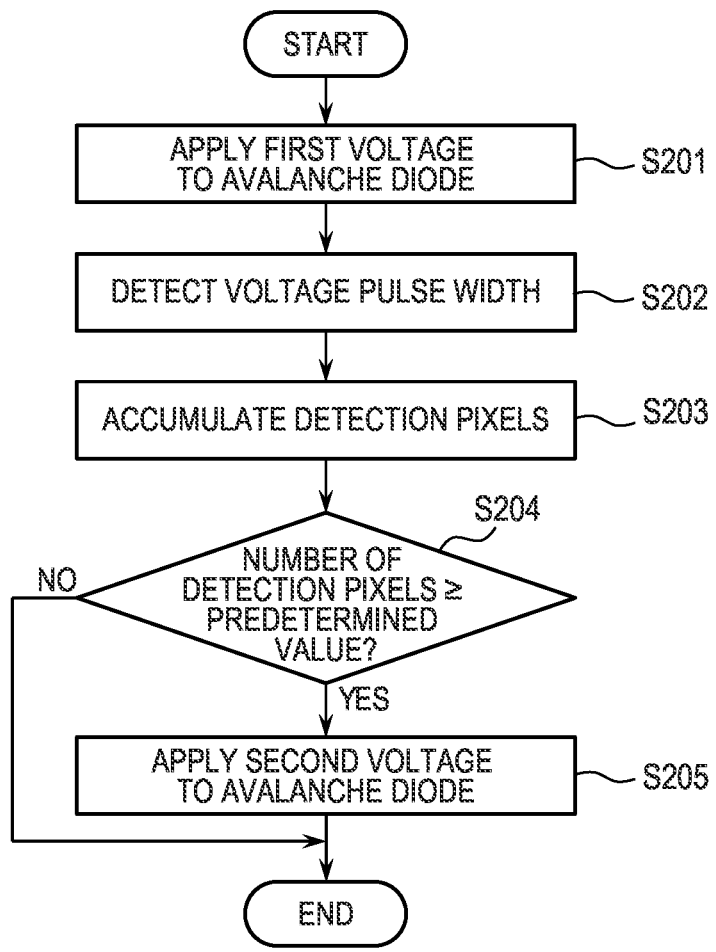
Figure 9:
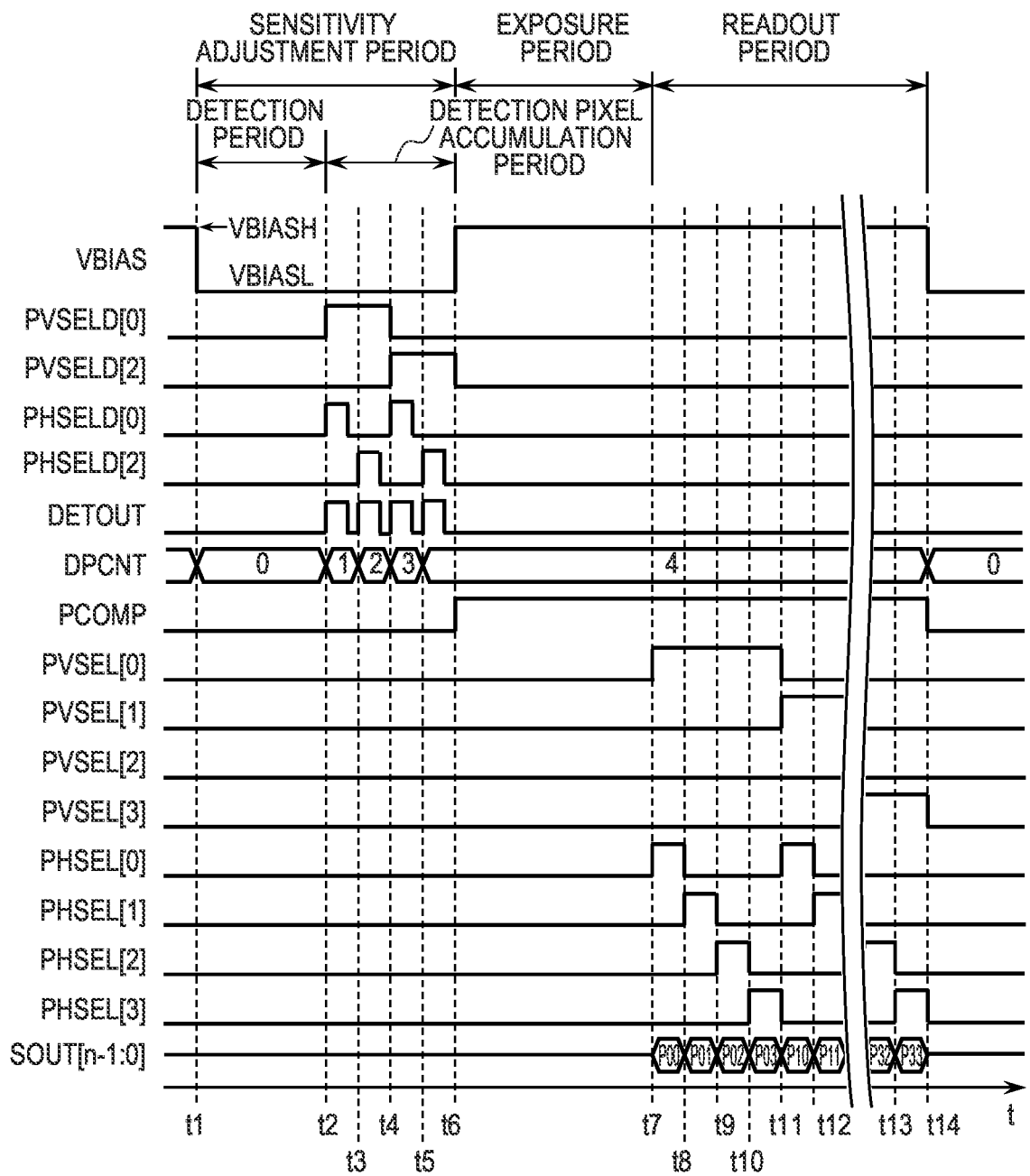
FIG. 9 is a timing diagram illustrating a method of driving the photoelectric conversion device according to the first embodiment of the present disclosure.

Next, a method of driving the photoelectric conversion device according to the present embodiment will be described with reference to FIG. 7 to FIG. 9. FIG. 7 and FIG. 8 are flowcharts illustrating an example of an imaging method in the photoelectric conversion device according to the present embodiment. FIG. 9 is a timing diagram illustrating a method of driving the photoelectric conversion device according to the present embodiment.

The photoelectric conversion device 100 according to the present embodiment may be driven according to the flowcharts illustrated in FIG. 7 and FIG. 8, for example.

First, when imaging is started, the photoelectric conversion device 100 executes a sensitivity adjustment period (Step S101). The photoelectric conversion device 100 controls the power supply voltage VBIAS in accordance with the incident light amount under the control of the control circuit 24 to adjust the sensitivity of the pixel P.

After the sensitivity adjustment period, the photoelectric conversion device 100 executes the exposure period (Step S103). The photoelectric conversion device 100 counts incident photons by each pixel P of the sensor unit 10 during a predetermined exposure period under the control of the control circuit 24.

After the exposure period, the photoelectric conversion device 100 executes a readout period (Step S104). Under the control of the control circuit 24, the photoelectric conversion device 100 sequentially outputs the values counted in each pixel P during the exposure period as the output signal SOUT, and terminates a series of imaging operations.

FIG. 8 is a flowchart illustrating an example of the sensitivity adjustment method in step S101 of the flowchart of FIG. 7.

In step S101, the photoelectric conversion device 100 first controls the power supply voltage VBIAS applied to the anode of the avalanche diode D to the first voltage (Step S201). The first voltage is a voltage that sufficiently increases the sensitivity of the pixel P.

Then, the photoelectric conversion device 100 exposes each pixel P of the sensor unit 10 for a predetermined detection period, and detects whether or not the width of the voltage pulse output from the light receiving unit is not smaller than the predetermined width (Step S202).

Next, the photoelectric conversion device 100 accumulates the number of pixels P (detection pixel) whose width of the voltage pulse output from the light receiving unit is not smaller than a predetermined width (Step S203).

Next, the photoelectric conversion device 100 determines whether or not the number of detection pixels is not less than a predetermined value (Step S204).

As a result of the determination in step S204, if the number of detection pixels is less than the predetermined value ("No" in step S204), it is determined that it is unnecessary to change the sensitivity setting of the pixel P, and the process in step S101 is ended.

If, as a result of the determination in step S204, the number of detection pixels is not less than the predetermined value ("Yes" in step S204), the process proceeds to step S205.

Then, in response to the fact that the number of detection pixels is not less than a predetermined value, the photoelectric conversion device 100 controls the power supply voltage VBIAS applied to the anode of the avalanche diode D to the second voltage (Step S205). The second voltage is a voltage at which the voltage between the terminals of the avalanche diode D becomes lower than when the first voltage is applied to the anode of the avalanche diode D, that is, a voltage at which the sensitivity of the pixel P becomes lower.

Thus, in the imaging method of the present embodiment, sensitivity adjustment is performed for each imaging. Therefore, when a plurality of images are continuously photographed, for example, in the case of video photographing, the sensitivity of the pixel P may be adjusted in real time for each frame. Therefore, even when the brightness of the object changes, imaging may be performed with appropriate sensitivity.

Next, a specific driving example of the photoelectric conversion device according to the present embodiment will be described with reference to FIG. 9. FIG. 9 is a timing diagram illustrating the operation of the photoelectric conversion device according to the present embodiment.

FIG. 9 illustrates, as an example, a case where the pixel P for detecting the width of the voltage pulse output from the pulse conversion unit 13 is 4 pixels of 0th row and 0th column, 0th row and 2nd column, 2nd row and 0th column, and 2nd row and 2nd column, and all of these 4 pixels output the detection signal DETOUT from the detection unit 15. It is assumed that all pixels P of the sensor unit 10 output the signal POUT from the signal generation unit 14.

FIG. 9 illustrates the power supply voltage VBIAS supplied from the voltage supply unit 26, the control signals PVSEL and PVSELD supplied from the row selection circuit 21, and the control signals PHSEL and PHSELD supplied from the column selection circuit 23. FIG. 9 further illustrates the detection signal DETOUT output from the selector unit 17 of the pixel P, the signal DPCNT output from the accumulation unit 27, the control signal PCOMP supplied from the signal comparison unit 28, and the output signal SOUT [n−1:0] of the photoelectric conversion device 100. [0], [1], [2], and [3] appended to the control signals PVSEL, PVSELD, PHSEL, and PHSELD indicate the corresponding row number or column number.

It is assumed that the power supply voltage VBIAS supplied from the voltage supply unit 26 may take one of the voltage VBIASL and the voltage VBIASH higher than the voltage VBIASL. When the power supply voltage VBIAS is the voltage VBIAL, the setting condition of high sensitivity is set, and when the power supply voltage VBIAS is the voltage VBIASH, the setting condition of low sensitivity is set.

The period from time t1 to time t6 corresponds to the sensitivity adjustment period in step S101.

At time t1, the counter of the accumulation unit 27 is reset, and the value of the signal DPCNT becomes 0. As a result, the control signal PCOMP of the signal comparison unit 28 becomes low level, and the power supply voltage VBIAS supplied from the voltage supply unit 26 becomes the voltage VBIASL which is a high-sensitivity setting condition. The period detection unit 16 of each pixel P starts detecting whether or not the width of the voltage pulse output from the light receiving unit is not smaller than the predetermined width. Here, a period from time t1 to time t2 is defined as a detection period.

The period from the time t2 to the time t6 is a detection pixel accumulation period for accumulating the number of pixels P (detection pixel) detected by the period detection unit 16 that the width of the voltage pulse is not smaller than the predetermined width.

At time t2, the control circuit 24 controls the control signals PVSELD [0] and PHSELD [0] from the low level to the high level by the row selection circuit 21 and the column selection circuit 23. The selector unit 17 of the pixel P00 in the 0th row and 0th column thus selected outputs the detection signal DETOUT to the voltage control unit 25. If the width of the voltage pulse output from the light receiving unit of the pixel P00 is not smaller than a predetermined width, the detection signal DETOUT becomes high level, and the accumulation unit 27 counts the detection signal DETOUT, and the value of the signal DPCNT becomes 1.

At time t3 after the control signal PHSELD [0] is controlled to the low level, the control circuit 24 controls the control signal PHSELD [2] from the low level to the high level by the column selection circuit 23. The selector unit 17 of the pixel P02 in the 0th row and 2nd column thus selected outputs the detection signal DETOUT to the voltage control unit 25. If the width of the voltage pulse output from the light receiving unit of the pixel P02 is not smaller than the predetermined width, the detection signal DETOUT becomes high level, and the accumulation unit 27 counts the detection signal DETOUT, and the value of the signal DPCNT becomes 2.

At time t4 after the control signal PHSELD [2] is controlled to the low level, the control circuit 24 controls the control signal PVSELD [0] from the high level to the low level by the row selection circuit 21. The control circuit 24 controls the control signals PVSELD [2] and PHSELD [0] from the low level to the high level by the row selection circuit 21 and the column selection circuit 23. The selector unit 17 of the pixel P20 of the 2nd row and 0th column thus selected outputs the detection signal DETOUT to the voltage control unit 25. If the width of the voltage pulse output from the light receiving unit of the pixel P20 is not smaller than the predetermined width, the detection signal DETOUT becomes high level, and the accumulation unit 27 counts the detection signal DETOUT, and the value of the signal DPCNT becomes 3.

At time t5 after the control signal PHSELD [0] is controlled to the low level, the control circuit 24 controls the control signal PHSELD [2] from the low level to the high level by the column selection circuit 23. The selector unit 17 of the pixel P22 of the 2nd row and 2nd column thus selected outputs the detection signal DETOUT to the voltage control unit 25. If the width of the voltage pulse output from the light receiving unit of the pixel P22 is not smaller than the predetermined width, the detection signal DETOUT becomes high level, and the accumulation unit 27 counts the detection signal DETOUT, and the value of the signal DPCNT becomes 4.

At time t6 after the control signal PHSELD [2] is controlled to the low level, the control circuit 24 controls the control signal PVSELD [2] from the high level to the low level by the row selection circuit 21, and ends the detection pixel accumulation period.

At time t6, the signal comparison unit 28 outputs the control signal PCOMP corresponding to the value of the signal DPCNT output from the accumulation unit 27 to the voltage supply unit 26.

Assuming that the reference value of the determination is 1, the signal comparison unit 28 receives the signal DPCNT having a value of 4, controls the control signal PCOMP from the low level to the high level, and outputs the control signal PCOMP to the voltage supply unit 26. Upon receiving the high-level control signal PCOMP, the voltage supply unit 26 changes the power supply voltage VBIAS from the voltage VBIASL to the voltage VBIASH. As a result, the photoelectric conversion device 100 becomes a setting condition of low sensitivity. If the value of the signal DPCNT is 0 under the same reference value, the control signal PCOMP remains at a low level, and the photoelectric conversion device 100 shifts to the exposure period under the setting condition of high sensitivity.

The period from the time t6 to the time t7 corresponds to the exposure period in step S103. Each of a plurality of pixels P constituting the sensor unit 10 counts voltage pulses output from the light receiving unit in the signal generation unit 14 during the exposure period. The number of incident photons may be counted more accurately by appropriately setting the detection sensitivity based on the information detected during the sensitivity adjustment period from time t1 to time t6.

The period from the time t7 to the time t14 corresponds to the readout period in step S104.

At time t7, the control circuit 24 controls the control signal PVSEL [0] from the low level to the high level by the row selection circuit 21. Thus, the signal generation unit 14 of the pixel P in each column of the selected 0th row outputs the signal POUT to the signal processing circuit 22.

Also at time t7, the control circuit 24 controls the control signal PHSEL [0] from the low level to the high level by the column selection circuit 23. Thus, the signal of the pixel P00 held in the column memory of the 0th column of the signal processing circuit 22 is output as the output signal SOUT via the horizontal output line HSIG.

At the following time t8, the control circuit 24 controls the control signal PHSEL [0] from the high level to the low level by the column selection circuit 23, and controls the control signal PHSEL [1] from the low level to the high level. Thus, the signal of the pixel P01 held in the column memory of the 1st column of the signal processing circuit 22 is output as the output signal SOUT via the horizontal output line HSIG.

At the following time t9, the control circuit 24 controls the control signal PHSEL [1] from the high level to the low level by the column selection circuit 23, and controls the control signal PHSEL [2] from the low level to the high level. Thus, the signal of the pixel P02 held in the column memory of the 2nd column of the signal processing circuit 22 is output as the output signal SOUT via the horizontal output line HSIG.

At the following time t10, the control circuit 24 controls the control signal PHSEL [2] from the high level to the low level by the column selection circuit 23, and controls the control signal PHSEL [3] from the low level to the high level. Thus, the signal of the pixel P03 held in the column memory of the 3rd column of the signal processing circuit 22 is output as the output signal SOUT via the horizontal output line HSIG.

At the time t11, the control circuit 24 controls the control signal PVSEL [0] from the high level to the low level by the row selection circuit 21, and controls the control signal PVSEL [1] from the low level to the high level. Thus, the selection of the 0th row is canceled, and the signal generation unit 14 of the pixel P of each column of the newly selected 1st row outputs the signal POUT to the signal processing circuit 22.

Also at time t11, the control circuit 24 controls the control signal PHSEL [3] from the high level to the low level by the column selection circuit 23, and controls the control signal PHSEL [0] from the low level to the high level. Thus, the signal of the pixel P10 held in the column memory of the 0th column of the signal processing circuit 22 is output as the output signal SOUT via the horizontal output line HSIG.

At the following time t12, the control circuit 24 controls the control signal PHSEL [0] from the high level to the low level by the column selection circuit 23, and controls the control signal PHSEL [1] from the low level to the high level. Thus, the signal of the pixel P11 held in the column memory of the 1st column of the signal processing circuit 22 is output as the output signal SOUT via the horizontal output line HSIG.

Thereafter, the signals of the pixels P in the 1st row and the 2nd column to the 3rd row and the 2nd column are similarly output as the output signal SOUT via the horizontal output line HSIG.

At the following time t13, the control circuit 24 controls the control signal PHSEL [2] from the high level to the low level by the column selection circuit 23, and controls the control signal PHSEL [3] from the low level to the high level. Thus, the signal of the pixel P33 held in the column memory of the 3rd column of the signal processing circuit 22 is output as the output signal SOUT via the horizontal output line HSIG.

At the time t14, the control circuit 24 controls the control signals PVSEL [3] and PHSEL [3] from the high level to the low level by the row selection circuit 21 and the column selection circuit 23, and completes the readout operation from the pixel P00 to the pixel P33.

After the time t14, the sensitivity adjustment period of the next frame is set, and the operation from the time t1 to the time t14 is repeated.

As described above, according to the present embodiment, in the photon-count type photoelectric conversion device, sensitivity adjustment at the time of high luminance may be appropriately performed.

Second Embodiment

A method of driving a photoelectric conversion device according to a second embodiment of the present disclosure will be described with reference to FIG. 10. Components similar to those of the photoelectric conversion device according to the first embodiment are denoted by the same reference numerals, and the description thereof is omitted or simplified.

In the present embodiment, another driving method of the photoelectric conversion device according to the first embodiment will be described. FIG. 10 is a timing diagram illustrating an operation example of the photoelectric conversion device according to the present embodiment.

Figure 10:
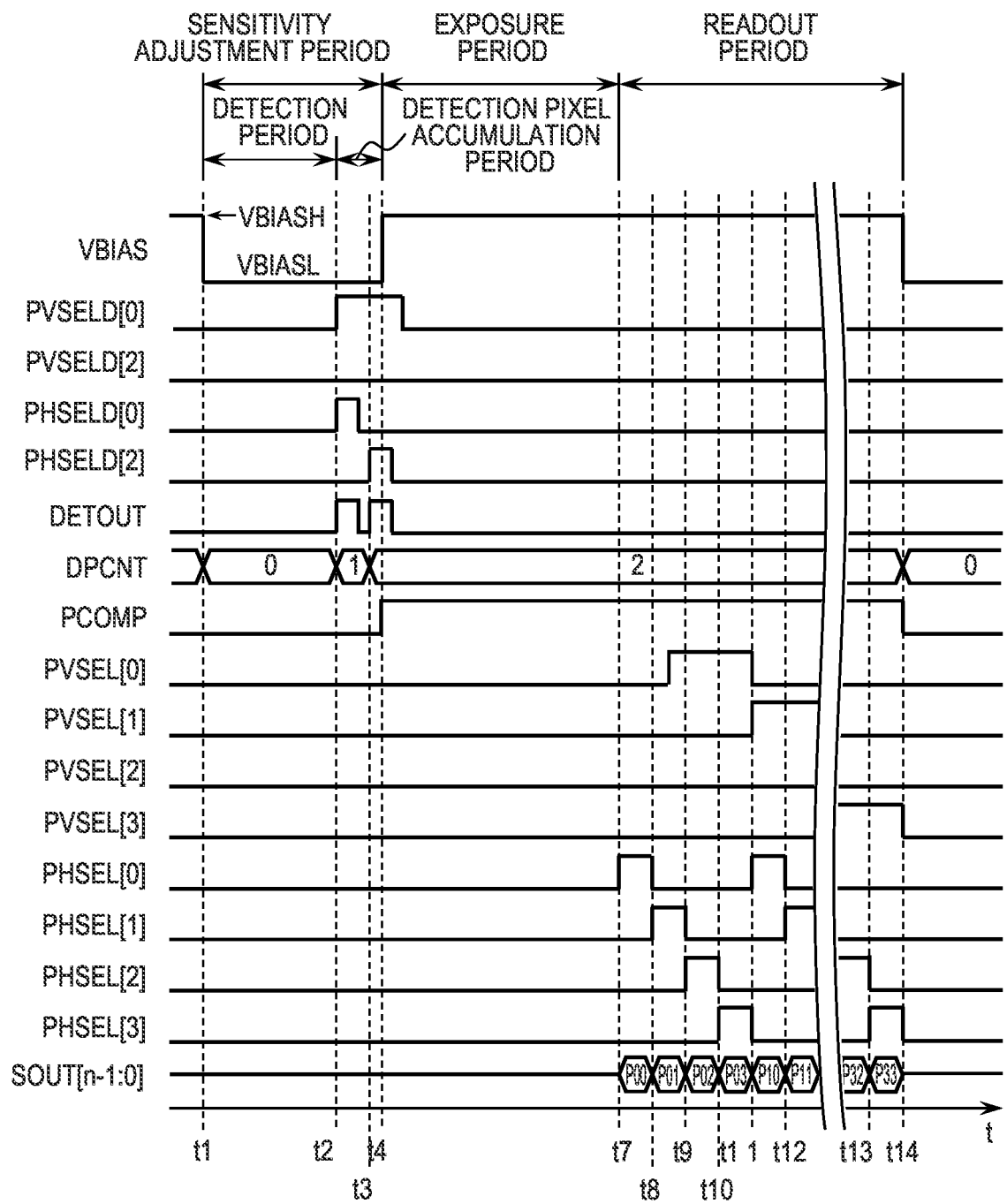
FIG. 10 is a timing diagram illustrating a method of driving a photoelectric conversion device according to a second embodiment of the present disclosure.

FIG. 10 illustrates, as an example, a case where the pixels P for detecting the width of the voltage pulse output from the pulse conversion unit 13 are 4 pixels of 0th row and 0th column, 0th row and 2nd column, 2nd row and 0th column, and 2nd row and 2nd column, and all of these 4 pixels output the detection signal DETOUT from the detection unit 15. It is assumed that all pixels P of the sensor unit 10 output a signal POUT from the signal generation unit 14. Further, it is assumed that the reference value of the determination by the signal comparison unit 28 is 2.

FIG. 10 illustrates the power supply voltage VBIAS supplied from the voltage supply unit 26, the control signals PVSEL and PVSELD supplied from the row selection circuit 21, and the control signals PHSEL and PHSELD supplied from the column selection circuit 23. FIG. 10 further illustrates the detection signal DETOUT output from the selector unit 17 of the pixel P, the signal DPCNT output from the accumulation unit 27, the control signal PCOMP supplied from the signal comparison unit 28, and the output signal SOUT [n−1:0] of the photoelectric conversion device 100. [0], [1], [2], and [3] appended to the control signals PVSEL, PVSELD, PHSEL, and PHSELD indicate corresponding row number or column number.

It is assumed that the power supply voltage VBIAS supplied from the voltage supply unit 26 may take one of the voltage VBIASL and the voltage VBIASH higher than the voltage VBIASL. When the power supply voltage VBIAS is the voltage VBIAL, the setting condition of high sensitivity is set, and when the power supply voltage VBIAS is the voltage VBIASH, the setting condition of low sensitivity is set.

The period from time t1 to time t4 corresponds to the sensitivity adjustment period of step S101.

At time t1, the counter of the accumulation unit 27 is reset, and the value of the signal DPCNT becomes 0. As a result, the control signal PCOMP of the signal comparison unit 28 becomes low level, and the power supply voltage VBIAS supplied from the voltage supply unit 26 becomes the voltage VBIASL which is a high-sensitivity setting condition. The period detection unit 16 of each pixel P starts detecting whether or not the width of the voltage pulse output from the light receiving unit is equal to or larger than the predetermined width. Here, a period from time t1 to time t2 is defined as a detection period.

The period from the time t2 to the time t4 is a detection pixel accumulation period for accumulating the number of pixels P (detection pixel) detected by the period detection unit 16 that the width of the voltage pulse is not smaller than the predetermined width.

At time t2, the control circuit 24 controls the control signals PVSELD [0] and PHSELD [0] from the low level to the high level by the row selection circuit 21 and the column selection circuit 23. The selector unit 17 of the pixel P00 in the 0th row and 0th column thus selected outputs the detection signal DETOUT to the voltage control unit 25. If the width of the voltage pulse output from the light receiving unit of the pixel P00 is not smaller than a predetermined width, the detection signal DETOUT becomes high level, and the accumulation unit 27 counts the detection signal DETOUT, and the value of the signal DPCNT becomes 1.

At time t3 after the control signal PHSELD [0] is controlled to the low level, the control circuit 24 controls the control signal PHSELD [2] from the low level to the high level by the column selection circuit 23. The selector unit 17 of the pixel P02 in the 0 row and 2 column thus selected outputs the detection signal DETOUT to the voltage control unit 25. If the width of the voltage pulse output from the light receiving unit of the pixel P02 is not smaller than a predetermined width, the detection signal DETOUT becomes high level, and the accumulation unit 27 counts the detection signal DETOUT, and the value of the signal DPCNT becomes 2.

At the following time t4, the signal comparison unit 28 receives the signal DPCNT whose value is 2, controls the control signal PCOMP from the low level to the high level, and outputs it to the voltage supply unit 26. Upon receiving the high-level control signal PCOMP, the voltage supply unit 26 changes the power supply voltage VBIAS from the voltage VBIASL to the voltage VBIASH. As a result, the photoelectric conversion device 100 becomes a setting condition of low sensitivity. If the value of the signal DPCNT is 0 under the same reference value, the control signal PCOMP remains at a low level, and the photoelectric conversion device 100 shifts to the exposure period under the setting condition of high sensitivity.

In the present embodiment, detection results (detected signal DETOUT) are sequentially received from the pixels P for detecting the width of the voltage pulse, and detection by the detection unit is stopped when the accumulation value (value of the signal DPCNT) of the detection pixels becomes the predetermined value or more. That is, when the value of the signal DPCNT reaches the reference value for determination in the signal comparison unit 28, the control signal PCOMP is immediately output to the voltage supply unit 26, and the detection pixel accumulation period ends. Therefore, the sensitivity adjustment period may be shortened as compared with the driving example of the first embodiment.

Since the operation during the period from the time t4 to the time t14 is the same as the driving example of the first embodiment illustrated in FIG. 9, description thereof is omitted here.

As described above, according to the present embodiment, in the photon-count type photoelectric conversion device, sensitivity adjustment at the time of high luminance may be appropriately performed. Further, since the sensitivity adjustment period may be shortened, the length of the exposure period in each frame may be increased accordingly. Thus, the dynamic range of the captured image may be expanded.

Third Embodiment

Figure 11:
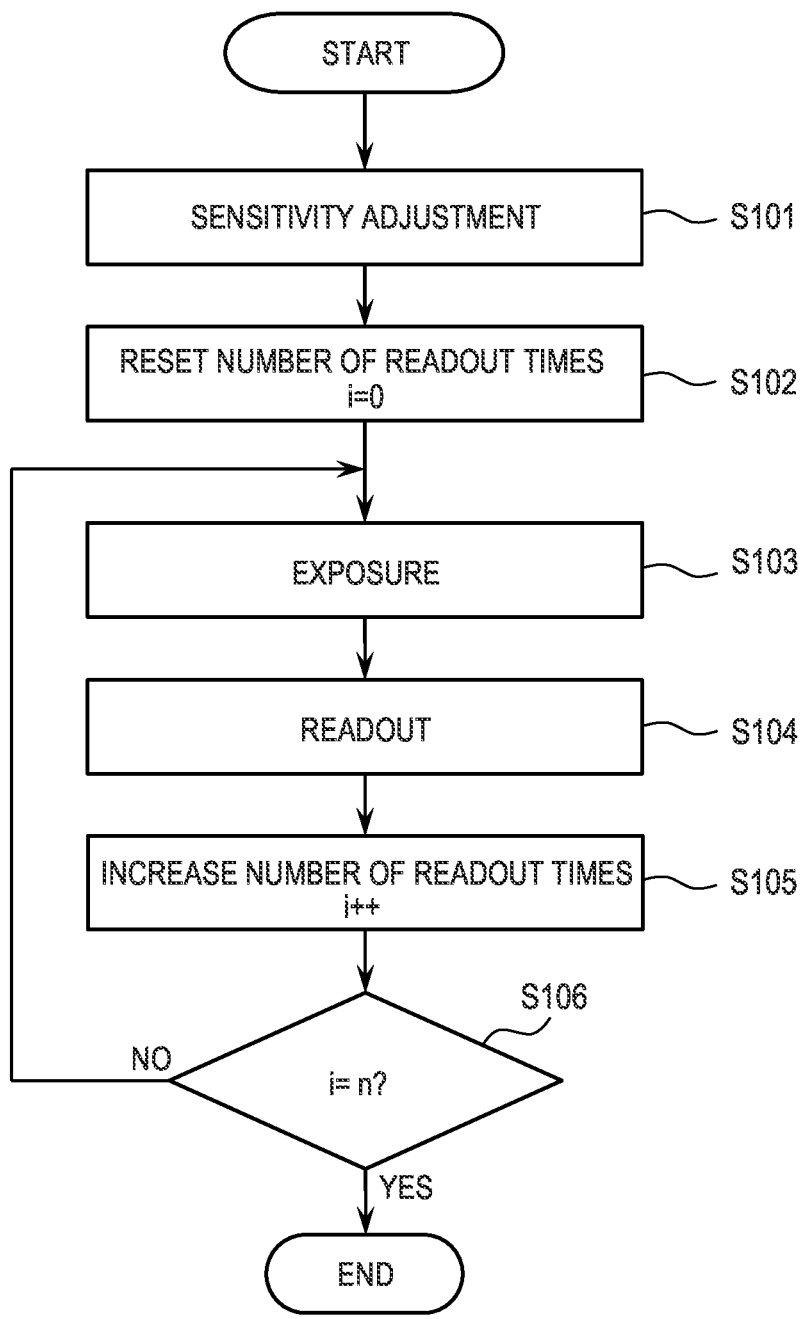
FIG. 11 is a flowchart illustrating an example of an imaging method in the photoelectric conversion device according to a third embodiment of the present disclosure.

A method of driving a photoelectric conversion device according to a third embodiment of the present disclosure will be described with reference to FIG. 11. Components similar to those of the photoelectric conversion device according to the first and second embodiments are denoted by the same reference numerals, and description thereof is omitted or simplified.

In the present embodiment, another driving method of the photoelectric conversion device according to the first embodiment will be described. FIG. 10 is a flowchart illustrating an imaging method in the photoelectric conversion device according to the present embodiment.

When imaging is started, the photoelectric conversion device 100 controls the power supply voltage VBIAS in accordance with the incident light quantity to adjust the sensitivity of the pixel P (Step S101).

Next, the photoelectric conversion device 100 resets the number of readout times i of the imaging signal to 0 (Step S102). The number of readout times i corresponds to the number of frames.

Then, the photoelectric conversion device 100 counts incident photons by each pixel P of the sensor unit 10 during the predetermined exposure period (Step S103).

Then, the photoelectric conversion device 100 sequentially reads out the values counted in each pixel P during the exposure period as the output signal SOUT (Step S104).

Then, in response to the readout operation in step S104, the photoelectric conversion device 100 increases the number of readout times i by 1 (Step S105).

Next, the photoelectric conversion device 100 determines whether or not the number of readout times i has reached the predetermined value (in the example of FIG. 11, n) (Step S106).

As a result of the determination in step S106, if the number of readout times i has not reached n ("No" in step S106), the process returns to step S103, and the exposure period of the next frame is started.

As a result of the determination in step S106, when the number of readout times i is n ("Yes" in step S106), the series of imaging operations is terminated.

As described above, in the imaging method of the present embodiment, after the sensitivity adjustment of the pixel P in step S101, the imaging is continuously performed n times (n frames). Therefore, when two or more n times of imaging are performed consecutively, the sensitivity adjustment period of (n−1) times may be omitted, and the length of the exposure period in each frame may be increased accordingly. Thus, the dynamic range of the captured image may be expanded.

Fourth Embodiment

Figure 12:
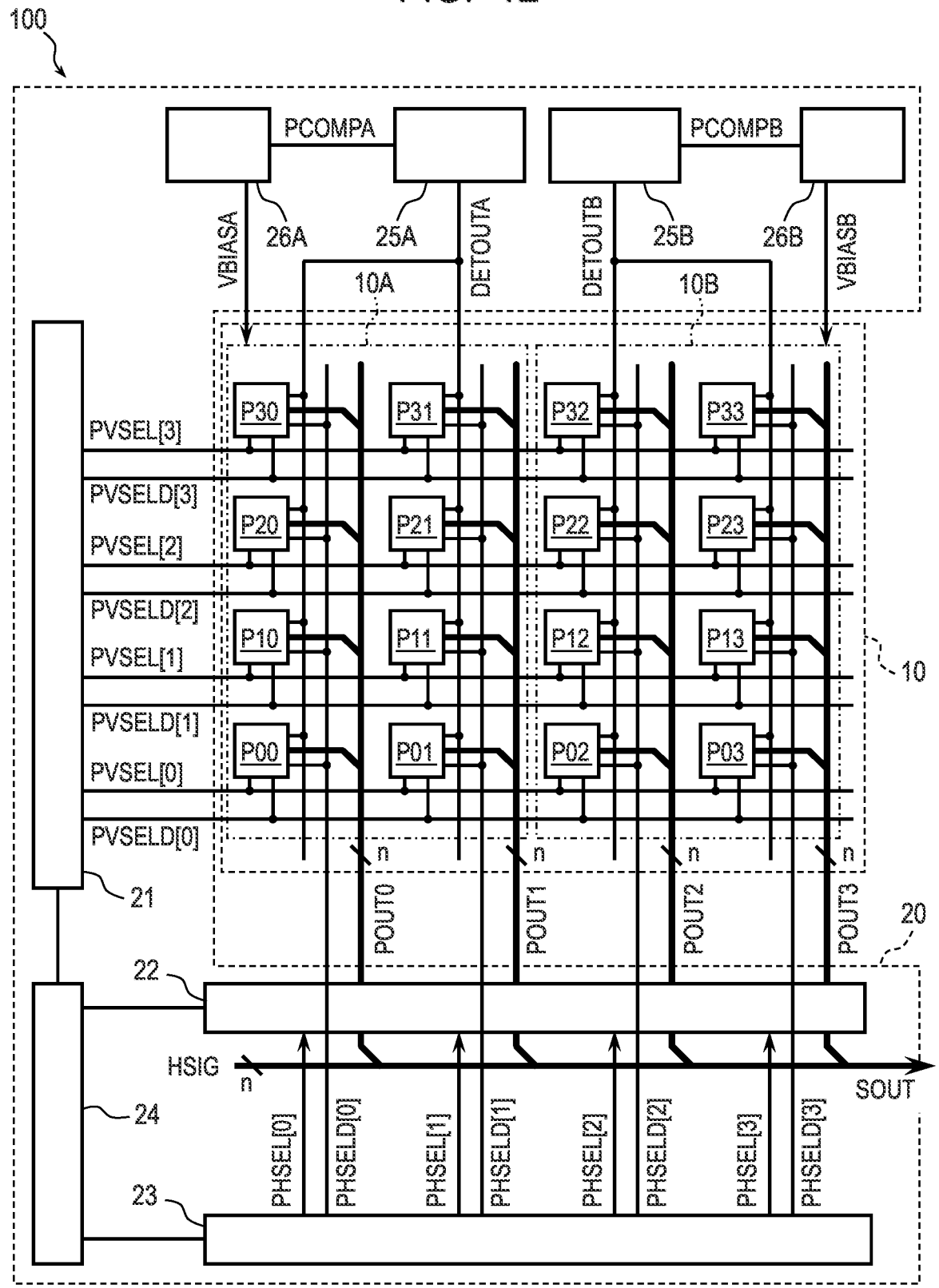
FIG. 12 is a block diagram illustrating a schematic configuration of a photoelectric conversion device according to a fourth embodiment of the present disclosure.

A photoelectric conversion device and a method of driving the same according to a fourth embodiment of the present disclosure will be described with reference to FIG. 12. Components similar to those of the photoelectric conversion device according to the first to third embodiments are denoted by the same reference numerals, and description thereof is omitted or simplified. FIG. 12 is a block diagram illustrating a schematic configuration of a photoelectric conversion device according to the present embodiment.

In the photoelectric conversion device 100 according to the present embodiment, as illustrated in FIG. 12, the sensor unit 10 is divided into a plurality of blocks 10A and 10B. The block 10A of the sensor unit 10 is provided with a voltage control unit 25A and a voltage supply unit 26A, and the block 10B of the sensor unit 10 is provided with a voltage control unit 25B and a voltage supply unit 26B.

The block 10A of the sensor unit 10 includes 8 pixels P arranged in each row of the 0th column and the 1st column. Each of the pixels P arranged in the block 10A is connected to the voltage control unit 25A via an output line DETOUTA. The voltage control unit 25A is connected to the voltage supply unit 26A.

The voltage control unit 25A is a circuit unit which accumulates the number of detection signals output from the pixels P arranged in the block 10A via the output line DETOUTA and compares the accumulation value with the predetermined value. The voltage control unit 25A has a function of generating a control signal PCOMPA corresponding to the result of the comparison and supplying it to the voltage supply unit 26A via a control line. The voltage supply unit 26A is a circuit unit that supplies the power supply voltage VBIASA set in accordance with the control signal PCOMPA to the pixel P arranged in the block 10A.

Similarly, the block 10B of the sensor unit 10 includes 8 pixels P arranged in each row of the 2nd column and 3rd column. Each of the pixels P arranged in the block 10B is connected to the voltage control unit 25B via an output line DETOUTB. The voltage control unit 25B is connected to the voltage supply unit 26B. The voltage supply unit 26B supplies the power supply voltage VBIASB to each of the pixels P arranged in the block 10B.

The voltage control unit 25B is a circuit unit which accumulates the number of detection signals output from the pixels P arranged in the block 10B via the output line DETOUTB and compares the accumulation value with the predetermined value. The voltage control unit 25B has a function of generating a control signal PCOMPB corresponding to the result of the comparison and supplying it to the voltage supply unit 26B via a control line. The voltage supply unit 26B is a circuit unit that supplies the power supply voltage VBIASB set in accordance with the control signal PCOMPB to the pixel P arranged in the block 10B.

As described above, in the photoelectric conversion device 100 according to the present embodiment, the sensor unit 10 is divided into a plurality of blocks, and the voltage control unit 25 and the voltage supply unit 26 are provided for each block. With this configuration, the sensitivity of the pixel P may be adjusted for each block of the sensor unit 10 at the time of high luminance.

Although FIG. 12 illustrates an example in which the sensor unit 10 is divided into two blocks, the number of blocks constituting the sensor unit 10 may be 3 or more. In FIG. 12, the sensor unit 10 is divided into a plurality of blocks in units of columns, but the sensor unit 10 may be divided into a plurality of blocks in units of rows. Alternatively, the sensor unit 10 may be divided into a plurality of blocks arranged in a matrix.

The number of rows and columns of the pixel array constituting one block is not particularly limited. The number of pixels P constituting one block may be one. The sizes of the plurality of blocks constituting the sensor unit 10 need not be uniform, and may be different for each block.

The voltage supply units 26A and 26B are not necessarily included in the photoelectric conversion device 100, and may be arranged in an external device. In this case, the control signals PCOMPA and PCOMPB of the voltage control units 25A and 25B are output to an external device of the photoelectric conversion device 100, and the voltages VBIASA and VBIASB may be controlled by the external device.

Fifth Embodiment

Figure 13:
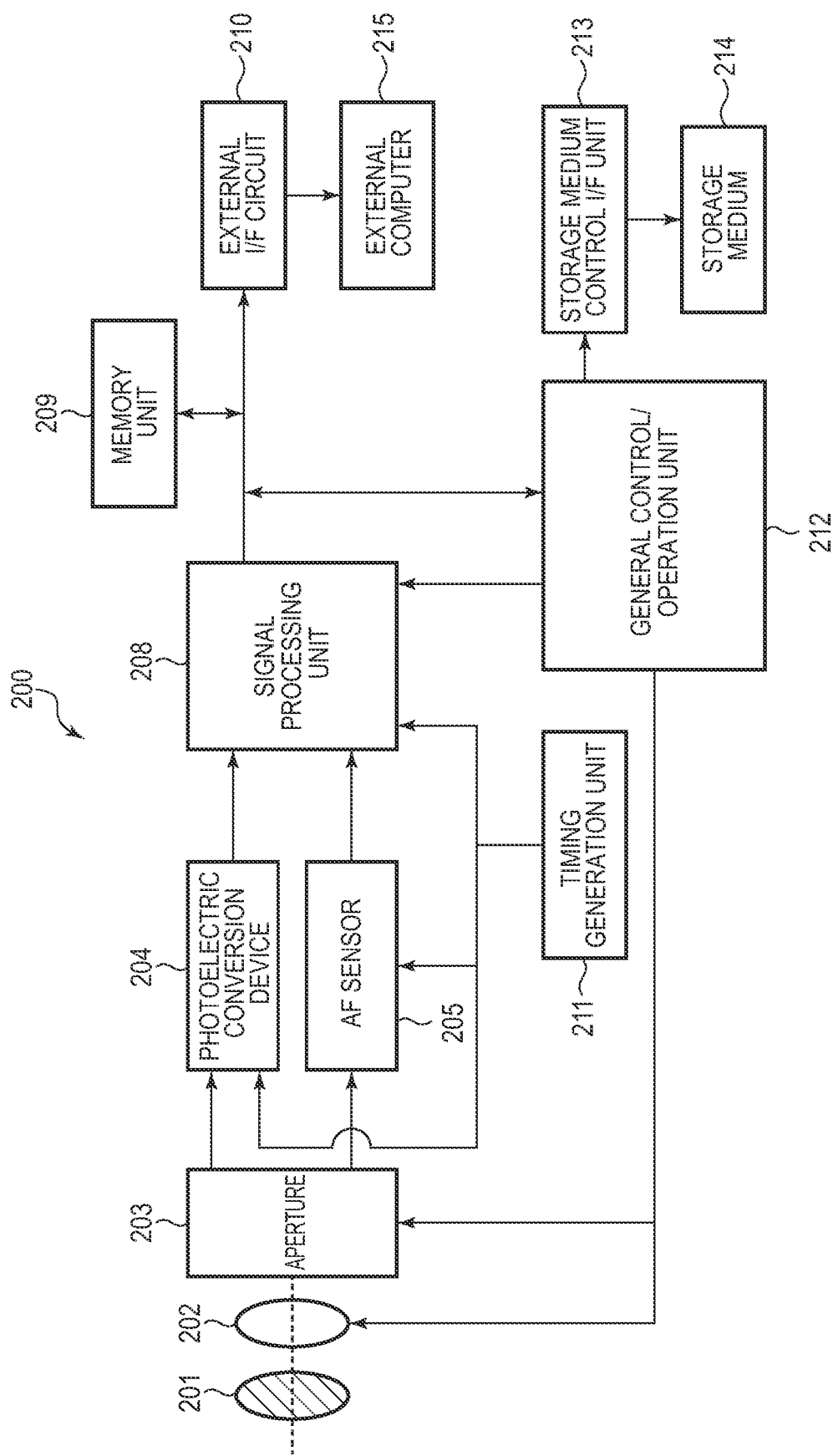
FIG. 13 is a block diagram illustrating a schematic configuration of an imaging system according to a fifth embodiment of the present disclosure.

An imaging system according to a fifth embodiment of the present disclosure will be described with reference to FIG. 13. FIG. 13 is a block diagram illustrating a schematic configuration of an imaging system according to the present embodiment.

As illustrated in FIG. 13, the imaging system 200 according to the present embodiment includes a barrier 201, a lens 202, an aperture 203, a photoelectric conversion device 204, and an AF sensor 205. The lens 202 is an optical system for forming an optical image of an object. The barrier 201 protects the lens 202. The aperture 203 adjusts the amount of light passing through the lens 202. The photoelectric conversion device 204 is configured by using the photoelectric conversion device 100 described in the first to fourth embodiments, and is for acquiring the optical image of the object imaged by the lens 202 as an image signal. The AF sensor 205 is for acquiring a signal necessary for focus detection.

The imaging system 200 further includes a signal processing unit 208. The signal processing unit 208 processes the signals output from the photoelectric conversion device 204 and the AF sensor 205, performs various kinds of correction on the obtained image data, or performs processing for compressing the data.

The imaging system 200 further includes a memory unit 209, an external I/F circuit 210, a timing generation unit 211, a general control/operation unit 212, and a storage medium control I/F unit 213. The memory unit 209 is for temporarily storing image data. The external I/F circuit 210 communicates with an external device such as an external computer 215. The timing generation unit 211 outputs various timing signals to the signal processing unit 208 or the like. The general control/operation unit 212 performs various operations and controls the entire camera. The storage medium control I/F unit 213 is for exchanging data with a removable storage medium 214 such as a semiconductor memory for storing acquired image data or reading out image data.

When the barrier 201 is opened, the optical image from the object is made incident on the AF sensor 205 through the lens 202 and the aperture 203. Based on the output signal from the AF sensor 205, the general control/operation unit 212 calculates the distance to the object by e.g., the phase difference detection method. Thereafter, the general control/operation unit 212 drives the lens 202 based on the calculation result, determines whether or not the image pickup surface is in focus again, and performs autofocus control for driving the lens 202 again when it is determined that the image pickup surface is not in focus.

Next, after the focusing is confirmed, the charge accumulation operation by the photoelectric conversion device 204 is started. When the charge accumulation operation of the photoelectric conversion device 204 is completed, the image signal output from the photoelectric conversion device 204 is written into the memory unit 209 by the general control/operation unit 212 via the signal processing unit 208.

Thereafter, the data stored in the memory unit 209 is stored on the storage medium 214 via the storage medium control I/F unit 213 under the control of the general control/operation unit 212. Alternatively, the data stored in the memory unit 209 may be directly input to the external computer 215 or the like via the external I/F circuit 210.

As described in the first to fourth embodiments, it is possible to reduce the error of the count value at the time of high brightness by using the photoelectric conversion device 100 described in the previous embodiments. Therefore, according to the imaging system of the present embodiment using the photoelectric conversion device 204, it is possible to obtain a higher quality image.

Sixth Embodiment

Figure 14A:
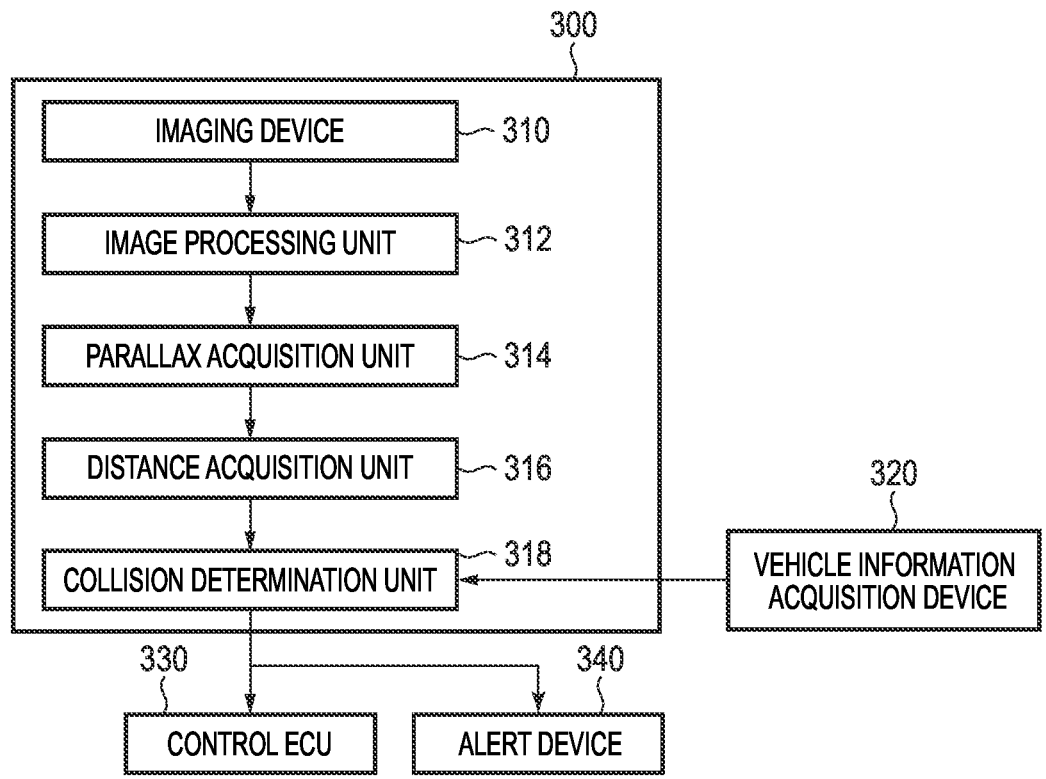
FIG. 14A is a diagram illustrating a configuration example of an imaging system according to a sixth embodiment of the present disclosure.
Figure 14B:
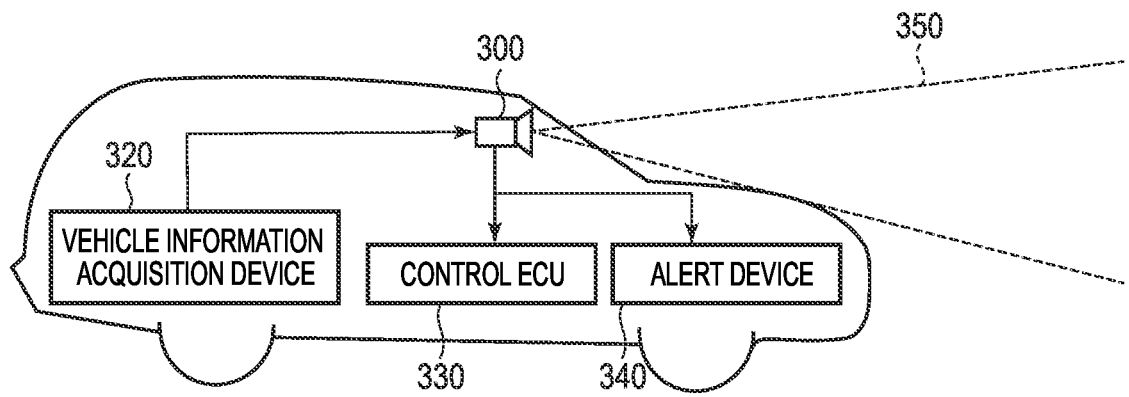
FIG. 14B is a diagram illustrating a configuration example of a movable object according to the sixth embodiment of the present disclosure.

An imaging system and a movable object according to a sixth embodiment of the present disclosure will be described with reference to FIGS. 14A and 14B. FIG. 14A is a diagram illustrating a configuration of an imaging system according to the present embodiment. FIG. 14B is a diagram illustrating a configuration of a movable object according to the present embodiment.

FIG. 14A illustrates an example of an imaging system for an on-vehicle camera. The imaging system 300 includes an imaging device 310. The imaging device 310 is a photoelectric conversion device 100 according to any one of the first to fourth embodiments. An imaging system 300 includes an image processing unit 312 that performs image processing on a plurality of image data acquired by the imaging device 310, and a parallax acquisition unit 314 that calculates parallax (phase difference of the parallax image) from the plurality of image data acquired by the imaging device 310. The imaging system 300 includes a distance acquisition unit 316 that calculates a distance to an object on the basis of the calculated parallax, and a collision determination unit 318 that determines whether there is a possibility of collision on the basis of the calculated distance. The parallax acquisition unit 314 and the distance acquisition unit 316 are examples of distance information acquisition means for acquiring distance information to an object. That is, the distance information is information on parallax, defocus amount, distance to an object, and the like. The collision determination unit 318 may determine the possibility of collision using any of these distance information. The distance information acquisition means may be realized by hardware designed exclusively or by a software module. It may be implemented by FPGA (Field Programmable Gate Array), ASIC (Application Specific Integrated Circuit) or the like, or a combination thereof.

The imaging system 300 is connected to the vehicle information acquisition device 320, and may acquire vehicle information such as vehicle speed, yaw rate, and steering angle. The imaging system 300 is connected to a control ECU 330 which is a control device that outputs a control signal for generating a braking force to a vehicle based on a determination result by the collision determination unit 318. The imaging system 300 is also connected to an alert device 340 for issuing an alert to the driver based on the determination result by the collision determination unit 318. For example, when the possibility of collision is high as a result of determination by the collision determination unit 318, the control ECU 330 performs vehicle control to avoid collision and reduce damage by applying a brake, returning an accelerator, suppressing engine output, and the like. The alert device 340 alerts the user by sounding an alarm such as a sound, displaying alert information on a screen such as a car navigation system, or vibrating a seat belt or a steering.

In the present embodiment, the imaging system 300 images the periphery of the vehicle, for example, the front or rear. FIG. 14B illustrates an imaging system for imaging the front of the vehicle (imaging range 350). The vehicle information acquisition device 320 sends an instruction to the imaging system 300 or the imaging device 310. With such a configuration, the accuracy of distance measurement may be further improved.

Although an example of controlling the vehicle so as not to collide with another vehicle has been described above, the present disclosure may be applied to a control for automatically driving following another vehicle or a control for automatically driving so as not to protrude from a lane. Further, the imaging system is not limited to a vehicle such as the own vehicle, but may be applied to a movable object (mobile device) such as a ship, an aircraft or an industrial robot. In addition, the present disclosure may be applied not only to a mobile object but also to an apparatus widely using object recognition, such as an intelligent transport system (ITS).

Modified Embodiment

The present disclosure is not limited to the above-described embodiments, and various modifications are possible.

For example, an example in which a part of the configuration of one embodiment is added to another embodiment, or an example in which a part of the configuration of another embodiment is substituted is also an embodiment of the present disclosure.

In the first to fourth embodiments, the voltage applied to the anode of the avalanche diode D is set to one of two kinds of voltage levels, but may be set to one of three or more kinds of voltage levels. In this case, an appropriate voltage level may be selected from among a plurality of voltage levels in accordance with, for example, the frequency of the voltage pulse output from the pulse conversion unit 13, the width of the pulse, and the like.

Further, the imaging systems described in the fifth and sixth embodiments are examples of imaging systems to which the photoelectric conversion device of the present disclosure may be applied, and the imaging systems to which the photoelectric conversion device of the present disclosure may be applied are not limited to the configurations illustrated in FIGS. 13 and 14A.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-119104, filed Jul. 10, 2020 which is hereby incorporated by reference herein in its entirety.

What is claimed is:

1. A photoelectric conversion device comprising:
a plurality of pixels each including an avalanche diode that photoelectrically converts incident light and multiplies generated charge by an avalanche multiplication, a quench circuit that reduces the avalanche multiplication of the avalanche diode, a pulse conversion circuit that converts an output signal of the avalanche diode into pulses, and a signal generation circuit that generates an accumulation signal obtained by integrating or accumulating a number of pulses output from the pulse conversion circuit;

a detection circuit that detects whether or not the pulse output from the pulse conversion circuit has a width not smaller than a predetermined width; and a voltage control circuit that controls a reverse bias voltage applied to the avalanche diode within a range not lower than a breakdown voltage of the avalanche diode based on a detection result of the detection circuit, wherein the voltage control circuit includes an accumulation circuit that accumulates the number of pixels that output a pulse having a pulse width not smaller than the predetermined width and a signal comparison circuit that compares an accumulation value by the accumulation circuit with a predetermined value, and when the accumulation value is not less than the predetermined value, the reverse bias voltage applied to the avalanche diode is lowered within a range not lower than the breakdown voltage of the avalanche diode.

2. The photoelectric conversion device according to claim 1, wherein the accumulation circuit sequentially receives the detection results from the plurality of pixels, and wherein the signal comparison circuit stops detection by the detection circuit when the accumulation value becomes the predetermined value or more.

3. The photoelectric conversion device according to claim 1, wherein, when a ratio of the pixels that output the pulse having the pulse width not smaller than the predetermined width among the plurality of pixels exceeds a predetermined ratio, the voltage control circuit lowers the reverse bias voltage applied to the avalanche diode within the range not lower than the breakdown voltage of the avalanche diode.

4. The photoelectric conversion device according to claim 1, wherein the detection circuit detects whether or not the width of the pulse is not smaller than the predetermined width with respect to a part of the pixels among the plurality of pixels.

5. The photoelectric conversion device according to claim 1, wherein the plurality of pixels is divided into a plurality of blocks, and wherein the voltage control circuit is provided for each of the plurality of blocks.

6. The photoelectric conversion device according to claim 1, wherein the voltage control circuit controls a voltage applied to an anode of the avalanche diode.

7. The photoelectric conversion device according to claim 1, wherein the voltage control circuit controls a voltage applied to a cathode of the avalanche diode.

8. A method of driving a photoelectric conversion device including a plurality of pixels each including an avalanche diode that photoelectrically converts incident light and multiplies generated charge by avalanche multiplication, a quench circuit that reduces the avalanche multiplication of the avalanche diode, a pulse conversion circuit that converts an output signal of the avalanche diode into pulses, and a signal generation circuit that generates an accumulation signal obtained by integrating or accumulating a number of pulses output from the pulse conversion circuit, the method comprising:

performing a sensitivity adjustment period for adjusting a sensitivity of the pixels, performing, after the sensitivity adjustment period, an exposure period for generating the accumulation signal, and performing, after the exposure period, a readout period for reading out the accumulation signal, wherein, in the sensitivity adjustment period, whether or not the width of the pulse output from the pulse conversion circuit is not smaller than a predetermined width is detected, a number of pixels whose pulse width is not smaller than the predetermined width is accumulated, and when an accumulation value is not less than a predetermined value, a reverse bias voltage applied to the avalanche diode is lowered within the range not lower than the breakdown voltage of the avalanche diode.

9. The method of driving a photoelectric conversion device according to claim 8, wherein the sensitivity adjustment period, the exposure period and the readout period are repeatedly performed.

10. The method of driving a photoelectric conversion device according to claim 8, wherein the exposure period and the readout period are repeatedly performed a predetermined number of times of not less than two between the sensitivity adjustment period and the next sensitivity adjustment period.

11. The method of driving a photoelectric conversion device according to claim 8, wherein the plurality of pixels is divided into a plurality of blocks, and wherein the reverse bias voltage applied to the avalanche diode is controlled for each of the plurality of blocks.

12. An imaging system comprising:

the photoelectric conversion device according to claim 1; and a signal processing circuit configured to process a signal output from the photoelectric conversion device.

* * * * *